United States Patent
Kohno

(10) Patent No.: US 6,614,633 B1
(45) Date of Patent: Sep. 2, 2003

(54) SEMICONDUCTOR DEVICE INCLUDING A SURGE PROTECTING CIRCUIT

(75) Inventor: Kenji Kohno, Gifu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/526,971

(22) Filed: Mar. 16, 2000

(30) Foreign Application Priority Data

Mar. 19, 1999 (JP) ............................................ 11-075243
Jul. 26, 1999 (JP) ............................................ 11-210908

(51) Int. Cl.⁷ .............................. H02H 9/00; H02H 3/22
(52) U.S. Cl. ............................ 361/56; 361/54; 361/111
(58) Field of Search ............................. 361/54, 56, 111, 361/91.6, 91.5; 327/309, 310; 257/355, 603, 362

(56) References Cited

U.S. PATENT DOCUMENTS

| | | | |
|---|---|---|---|
| 4,492,974 A | 1/1985 | Yoshida et al. | 357/23 |
| 4,894,568 A | 1/1990 | Pavlin | 307/584 |
| 5,115,369 A | 5/1992 | Robb et al. | 361/93 |
| 5,119,162 A | 6/1992 | Todd et al. | 357/23 |
| 5,162,966 A | 11/1992 | Fujihira | 257/140 |
| 5,181,095 A | 1/1993 | Mosher et al. | 257/370 |
| 5,256,582 A | 10/1993 | Mosher et al. | 437/31 |
| 5,397,914 A | 3/1995 | Suda et al. | 257/570 |
| 5,401,996 A | 3/1995 | Kelly | 257/360 |
| 5,502,338 A | 3/1996 | Suda et al. | 257/570 |
| 5,838,526 A | 11/1998 | Ishikawa et al. | 361/118 |
| 5,883,537 A | * 3/1999 | Luoni et al. | 327/318 |
| 5,963,407 A | * 10/1999 | Fragapane et al. | 361/115 |
| 5,986,861 A | * 11/1999 | Pontarollo | 361/56 |

FOREIGN PATENT DOCUMENTS

| | | |
|---|---|---|
| EP | 0802567 A | 10/1997 |
| JP | 50-36942 | 4/1975 |
| JP | 53-26944 | 3/1978 |
| JP | 57-141962 | 9/1982 |
| JP | 59-201633 | 11/1984 |
| JP | 5-13660 | 1/1993 |
| JP | 6-275634 | 9/1994 |
| JP | 6-318707 | 11/1994 |
| JP | 8-64812 | 3/1996 |
| JP | 9-298834 | 11/1997 |
| JP | 10-4180 | 1/1998 |
| JP | 10-313064 | 11/1998 |

\* cited by examiner

Primary Examiner—Kim Huynh
(74) Attorney, Agent, or Firm—Harness, Dickey & Pierce, PLC

(57) ABSTRACT

A protecting apparatus includes a back-flow preventing Zener diode having a cathode connected directly to a control terminal of a main transistor formed on a semiconductor substrate. A protecting transistor has an output terminal connected to an anode of the back-flow preventing Zener diode and an input terminal connected to an input terminal of the main transistor. A protecting capacitor or Zener diode circuit is connected between a control terminal of the protecting transistor and the input terminal of the main transistor for allowing initial surge current, when caused based on a rapid surge, to flow into the control terminal of the protecting transistor. The protecting transistor, when turning on in response to the initial surge current, allows next surge current succeeding the initial surge current to flow into the control terminal of the main transistor via the back-flow preventing Zener diode. And, the main transistor, when turning on in response to the next surge current, allows late surge current succeeding the next surge current to flow therethrough.

7 Claims, 29 Drawing Sheets

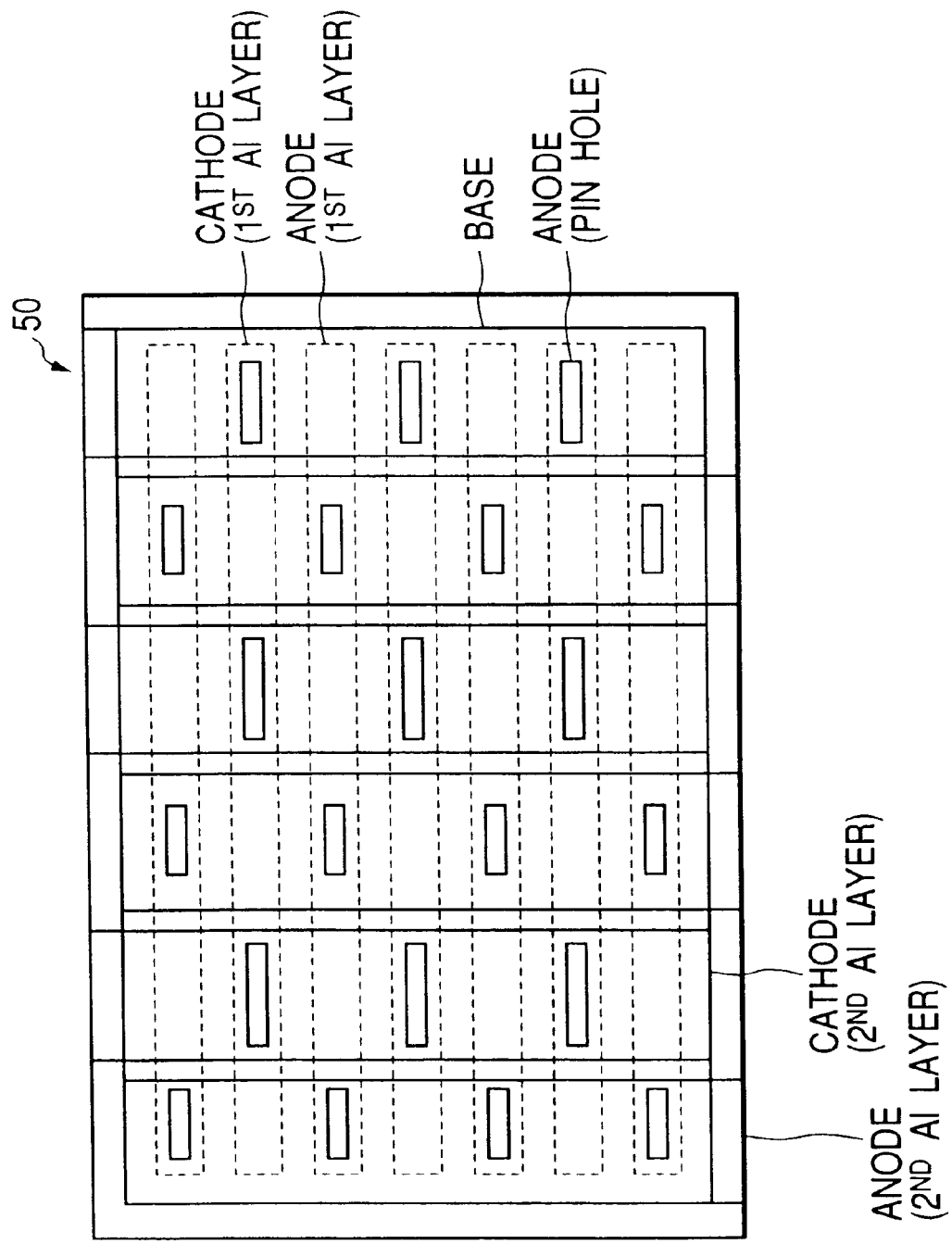

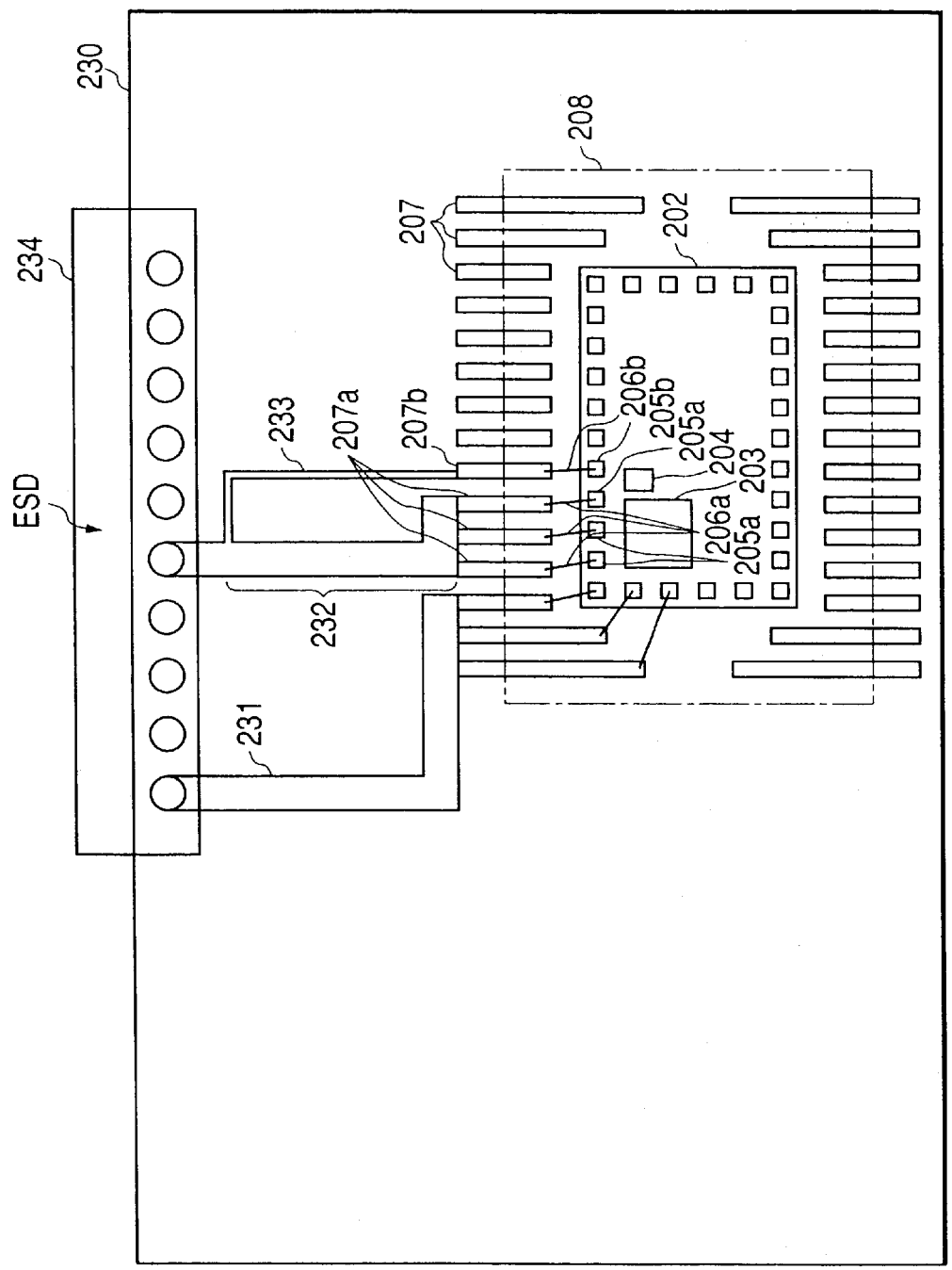

SEMICONDUCTOR DEVICE INCLUDING A SURGE PROTECTING CIRCUIT

BACKGROUND OF THE INVENTION

The present invention relates to a semiconductor device including a protecting circuit which is capable of preventing the semiconductor device from a rapid surge. The present invention is applicable to insulated gate transistors, such as power metal oxide semiconductor field effect transistors (abbreviated MOSFETs) and insulated gate bipolar transistors (abbreviated IGBTs).

FIG. 22 shows a conventional semiconductor device. A protecting apparatus of this conventional semiconductor device comprises a serial circuit 3 consisting of a plurality of clamping Zener diodes. The serial circuit 3 is connected between drain and gate electrodes of a double diffused metal oxide semiconductor (DMOS) field-effect transistor 2 which is actuated by a gate actuating circuit 8. The purpose of providing the serial circuit 3 is to improve the surge durability against a surge voltage caused by an inductive load 1.

According to the circuit arrangement shown in FIG. 22, when the semiconductor device receives a surge voltage applied from the inductive load 1, each Zener diode in the serial circuit 3 causes breakdown at a predetermined voltage level lower than that of the field-effect transistor 2. Thus, the field-effect transistor 2 turns on in response to electric charge input to the gate electrode thereof. Surge current, corresponding to the surge voltage, flows through the field-effect transistor 2. In the following description, the field-effect transistor is referred to or abbreviated as FET.

As the operation resistance of FET 2 has a positive temperature coefficient, no current concentration occurs. Accordingly, FET 2 causes no internal breakdown. A parasitic transistor 2a of FET 2 does not operate. The surge durability of the semiconductor device is improved.

In this semiconductor device, each Zener diode in the serial circuit 3 may be a multiple polysilicon Zener diode including alternately doped boron and phosphor, or a multiple Zener diode formed by diffusing base and emitter layers in a power integrated circuit.

Thus, the Zener diodes are not large in chip size. The overall size of the Zener diodes is generally small compared with that of FET 2.

The internal resistance of all Zener diodes in the serial circuit 3 is usually a large value equal to approximately 1 kΩ. To allow the current to smoothly flow, it is necessary to maintain breakdown voltage of each Zener diode (which is usually 10V lower than the withstand voltage of FET 2). Thus, a sufficiently large bias cannot be applied to the gate electrode of FET 2. Hence, a current amount flowing in response to the turning-on operation of FET 2 is small. In other words, it is difficult to sufficiently improve the durability against a rapid and large-current surge caused by an electrostatic discharge (abbreviated ESD, hereinafter).

FIG. 23 shows a conventional semiconductor device proposed in the Unexamined Japanese patent publication No. 8-64812.

According to the circuit arrangement shown in FIG. 23, a protecting circuit 4, a back-flow preventing Zener diode 5 and a resister 6 are connected between an inductive load 1 and the gate electrode of FET 2.

The protecting circuit 4 includes a DMOS-FET 4a. This FET 4a has a drain electrode connected to a drain electrode of FET 2 and a source electrode connected via the Zener diode 5 and the resister 6 to the gate electrode of FET 2.

Furthermore, the protecting circuit 4 includes a capacitor 4b which is connected between the gate and drain electrodes of FET 4a. The capacitor 4b is connected in parallel with a serial circuit which consists of a plurality of clamping Zener diodes 4c connected in series. A resister 7 is interposed between the gate and source electrodes of FET 4a.

When a surge voltage caused by the inductive load 1 is applied to the protecting circuit 4, the surge current passes the capacitor 4a and flows into the gate electrode of FET 4a. Thus, FET 4a turns on in the initial stage.

In response to the turning-on operation of FET 4a, the surge current based on the surge voltage caused by the inductive load 1 flows into the gate electrode of FET 2 via FET 4a, Zener diode 5 and the resister 6, so as to turn on FET 2. Thus, the surge current flows across FET 2 from the inductive load 1.

However, when the surge voltage is an ESD surge causing rapid and large current (having operation time of approximately 10 nsec, peak current of approximately 160 A, 150Ω, 150 pF, and 25 kV discharge), it is necessary to quickly increase the gate potential of FET 2 to a higher level (e.g., 10 times the threshold value of FET 2) in a short time (e.g., within 1 nsec) by turning on FET 4a. When FET 2 turns on, the surge current flows across FET 2.

However, as described above, the resister 6 is interposed between the Zener diode 5 and the gate electrode of FET 2. The resister 6 limits the charge current flowing into the gate electrode of FET 2. Thus, it becomes impossible to quickly and sufficiently charge the gate electrode of FET 2.

Accordingly, there is the possibility that the internal diode of FET 2 induces avalanche breakdown. In a worst case, the parasitic bipolar transistor of FET 2 may operate and induce permanent damage due to current concentration. As a result, the ESD durability of FET 2 (or the semiconductor device) may deteriorate.

SUMMARY OF THE INVENTION

In view of the foregoing, an object of the present invention is to provide a protecting apparatus for a semiconductor device which is capable of surely protecting the semiconductor device from the rapid surge, such as ESD surge.

In order to accomplish this and other related objects, the present invention provides a protecting apparatus for protecting a main transistor formed on a semiconductor substrate from a rapid surge, comprising a back-flow preventing Zener diode having a cathode connected directly to a control terminal of the main transistor for preventing current from flowing in a predetermined direction, a protecting transistor having an output terminal connected to an anode of the back-flow preventing Zener diode and an input terminal connected to an input terminal of the main transistor, and a protecting capacitor connected between a control terminal of the protecting transistor and the input terminal of the main transistor for allowing initial surge current, when caused based on a rapid surge, to flow into the control terminal of the protecting transistor. The protecting transistor, when turning on in response to the initial surge current, allows next surge current succeeding the initial surge current to flow into the control terminal of the main transistor via the back-flow preventing Zener diode. And, the main transistor, when turning on in response to the next surge current, allows late surge current succeeding the next surge current to flow therethrough.

According to this arrangement, no resister is connected between the protecting transistor and the main transistor. Only the back-flow preventing Zener diode, having a small internal resistance value, is connected between the protecting transistor and the main transistor. Thus, the current amount of next surge current flowing through the protecting transistor is not limited or suppressed. The next surge current smoothly flows into the control terminal of the main transistor.

With this arrangement, the next surge current serving as charging current quickly and sufficiently flows into the control terminal of the main transistor. Hence, the main transistor turns on immediately without inducing the avalanche breakdown of the diode constituting a parasitic element or without activating the transistor constituting a parasitic element. The late surge current can smoothly flow through the main transistor. Thus, it becomes possible to improve the ESD durability of the semiconductor device.

The present invention provides another protecting apparatus for protecting a main transistor formed on a semiconductor substrate from a rapid surge. The protecting apparatus comprises a back-flow preventing Zener diode having a cathode connected directly to a control terminal of the main transistor for preventing current from flowing in a predetermined direction. A protecting transistor has an output terminal connected to an anode of the back-flow preventing Zener diode and an input terminal connected to an input terminal of the main transistor. A Zener diode circuit is connected between a control terminal of the protecting transistor and the input terminal of the main transistor for allowing initial surge current, when caused based on a rapid surge, to flow into the control terminal of the protecting transistor. The protecting transistor, when turning on in response to the initial surge current, allows next surge current succeeding the initial surge current to flow into the control terminal of the main transistor via the back-flow preventing Zener diode. And, the main transistor, when turning on in response to the next surge current, allows late surge current succeeding the next surge current to flow therethrough.

According to this arrangement, when the next surge current flows into the input terminal of the protecting transistor, the Zener diodes in the Zener diode circuit causes breakdown to allow the next surge current to flow into the control terminal of the protecting transistor. The protecting transistor turns on in response to the input next surge current. In response to the turning-on operation of the protecting transistor, the main transistor turns on so as to allow the late surge current to flow therethrough.

Furthermore, it is preferable that the main transistor and the protecting transistor are metal oxide semiconductor field-effect transistors. It is also preferable that an auxiliary protecting transistor is connected between the protecting transistor and the protecting capacitor or the Zener diode circuit for amplifying the initial surge current and supplying the amplified initial surge current to the control terminal of the protecting transistor.

According to this arrangement, the initial surge current flows through the protecting capacitor or the Zener diode circuit. The auxiliary protecting transistor is charged at its control terminal by the protecting capacitor or the Zener diode circuit. The protecting transistor is charged at its control terminal by the turned-on auxiliary protecting transistor. Therefore, the electric potential of the control terminal of the auxiliary protecting transistor can be increased to a higher voltage level. Thus, a large amount of current flows through the main transistor.

As a result, the bias voltage level of the control terminal of the main transistor becomes higher. The maximum value of the saturated current responsive to the turning-on operation of the main transistor becomes large. Accordingly, the ESD durability can be improved.

It is preferable that all of the main transistor, the protecting transistor, and the auxiliary protecting transistor are metal oxide semiconductor field-effect transistors.

Furthermore, it is preferable that the protecting transistor comprises a built-in (or internal) back-flow preventing Zener diode.

Furthermore, it is preferable that a protecting Zener diode is connected in parallel with the protecting capacitor. A first initial surge current flows through the protecting capacitor. And, a second initial surge current, succeeding the first initial surge current, flows through the protecting Zener diode.

Furthermore, it is preferable that the main transistor is a metal oxide semiconductor field-effect transistor and the protecting transistor is a bipolar transistor. It is also preferable that the main transistor is a metal oxide semiconductor field-effect transistor, and the protecting transistor and the auxiliary protecting transistor are bipolar transistors.

The present invention provides another protecting apparatus for protecting a main transistor formed on a semiconductor substrate from a rapid surge, comprising a back-flow preventing Zener diode having a cathode connected to a control terminal of the main transistor for preventing current from flowing in a predetermined direction, a protecting Zener diode having an anode connected to an anode of the back-flow preventing Zener diode and a cathode connected to an input terminal of the main transistor, and a protecting capacitor connected in parallel with the protecting Zener diode for allowing initial surge current, when caused based on a rapid surge, to flow into the control terminal of the main transistor via the back-flow preventing Zener diode. The protecting Zener diode allows next surge current succeeding the initial surge current to flow into the control terminal of the main transistor via the back-flow preventing Zener diode, and the main transistor, when turning on in response to the initial surge current or the next surge current, allows late surge current succeeding the next surge current to flow therethrough.

According to this arrangement, the initial surge current flows into the control terminal of the main transistor via the protecting capacitor and the back-flow flow preventing Zener diode. Then, the next surge current flows into the control terminal of the main transistor via the protecting Zener diode, and the back-flow preventing Zener diode.

No resister is connected between the anode of the protecting Zener diode and the control terminal of the main transistor. Only the back-flow preventing Zener diode, having a small internal resistance value, is connected between the anode of the protecting Zener diode and the control terminal of the main transistor.

Thus, the current amounts of initial surge current and next surge current flowing through the back-flow preventing Zener diode are not limited or suppressed. Both the initial surge current and the next surge current successively flow quickly and sufficiently into the control terminal of the main transistor as charge current.

Hence, the main transistor turns on immediately without inducing the avalanche breakdown of the diode constituting a parasitic element or without activating the transistor constituting a parasitic element. The late surge current can smoothly flow through the main transistor. Thus, it becomes possible to improve the ESD durability of the semiconductor device.

The present invention provides another protecting apparatus for protecting a main transistor formed on a semiconductor substrate from a rapid surge, comprising a back-flow preventing Zener diode having a cathode connected to a control terminal of the main transistor for preventing current from flowing in a predetermined direction, and a protecting transistor circuit including a plurality of transistors consisting of an initial transistor and at least one succeeding transistor connected in a Darlington connecting pattern, each transistor having an output terminal connected to an anode of the back-flow preventing Zener diode and an input terminal connected to an input terminal of the main transistor. The protecting transistor circuit turns on the succeeding transistor in response to initial surge current caused based on a rapid surge, and further turns on the initial transistor in response to the turning of the succeeding transistor. The initial transistor, when turning on, allows next surge current succeeding the initial surge current to flow into the control terminal of the main transistor. And, the main transistor, when turning on in response to the next surge current, allows late surge current succeeding the next surge current to flow therethrough.

According to this arrangement, the plurality of transistors connected in the Darlington connecting pattern sufficiently amplify the current flowing into the control terminal of the main transistor via the back-flow preventing Zener diode.

Hence, the main transistor turns on immediately. The late surge current can sufficiently flow through the main transistor without activating the parasitic element. As a result, it becomes possible to improve the ESD durability of the semiconductor device. In this case, it is preferable that the main transistor and each transistor in the protecting transistor circuit are metal oxide semiconductor field-effect transistors.

Furthermore, it is preferable that there is a protecting Zener diode connected in parallel with the protecting transistor. The protecting Zener diode has a cathode connected to the input terminal of the main transistor and an anode connected to the anode of the back-flow preventing Zener diode.

The main transistor controls current supplied to an inductive load connected to the input terminal of the main transistor. The inductive load generates an inductive load surge when the current supply is stopped. The rapid surge is caused by an electrostatic discharge. The inductive load surge is small in frequency than the rapid surge. And, the protecting Zener diode causes breakdown in response to the inductive load surge so as to turn on the main transistor prior to a turning-on operation of the protecting transistor by the protecting capacitor.

Accordingly, the inductive load surge having a smaller frequency compared with the rapid surge causes the breakdown and turns on the main transistor. Hence, it becomes possible to protect the main transistor against the inductive load surge as well as the rapid surge. In this case, it is preferable that the rapid surge has a frequency in the range of GHz, and the inductive load surge has a frequency in the range of kHz. A relationship Rd>Rh is satisfied, where Rh represents an operation resistance in a flowing path of the next surge current flowing into the control terminal of the main transistor via the back-flow preventing Zener diode, and Rd represents an actuating resistance disposed in a path connected to an actuating circuit for actuating the main transistor.

With this arrangement, it becomes possible to increase the voltage drop at the actuating resistance to a higher voltage level sufficiently higher than the threshold voltage of the main transistor. This voltage drop is required for operating the main transistor when the ESD surge is applied.

Furthermore, it is preferable that the main transistor is formed as a cell region including a plurality of single cells on the semiconductor substrate. The control terminal of the main transistor is formed as a common electrode of the plurality of single cells. The control terminal of the main transistor extends out of the cell region. A signal applying electrode, connected to the control terminal of the main transistor, is formed on a surface of the semiconductor substrate so as to surround the cell region. The signal applying electrode is connected to the cathode of the back-flow preventing Zener diode. A wiring width of the signal applying electrode is wider than a wiring width of a lead connecting the cathode of the back-flow preventing Zener diode to the signal applying electrode.

Moreover, another object of the present invention is to provide a semiconductor device which is capable of improving the surge durability by raising the gate potential of the transistor so as to increase the operation current of the transistor.

In order to accomplish this and other related objects, the present invention provides a semiconductor device comprising an insulated gate transistor disposed in a current path of an electric load, a gate voltage boosting element having one end connected to a gate electrode of the insulated gate transistor so as to operate in response to a surge applied from a high-voltage terminal of the insulated gate transistor, a wiring member serving as a parasitic inductance against the applied surge. The wiring member is connected in parallel with the gate voltage boosting element with respect to the high-voltage terminal of the insulated gate transistor. The insulated gate transistor and the gate voltage boosting element are formed in a chip, while the wiring member is provided outside the chip.

According to this circuit arrangement, the wiring member (e.g., bonding wire, conductive pattern on a printed circuit board) is utilized as a parasitic inductance (i.e., impedance). This parasitic inductance boosts the input voltage of the gate voltage boosting element (e.g., Zener diode). Thus, it becomes possible to raise the gate potential of the insulated gate transistor. A great amount of operation current flows through the insulated gate transistor, thereby improving the surge durability.

BRIEF DESCRIPTION OF THE DRAWINGS

The above and other objects, features and advantages of the present invention will become more apparent from the following detailed description which is to be read in conjunction with the accompanying drawings, in which:

FIG. 19 is a plan view showing a modified Zener diode in accordance with the twelfth embodiment of the present invention;

FIG. 31 is a plan view showing a practical arrangement of the semiconductor device in accordance with the thirteenth embodiment of the present invention;

DESCRIPTION OF THE PREFERRED EMBODIMENTS

Figure 1:
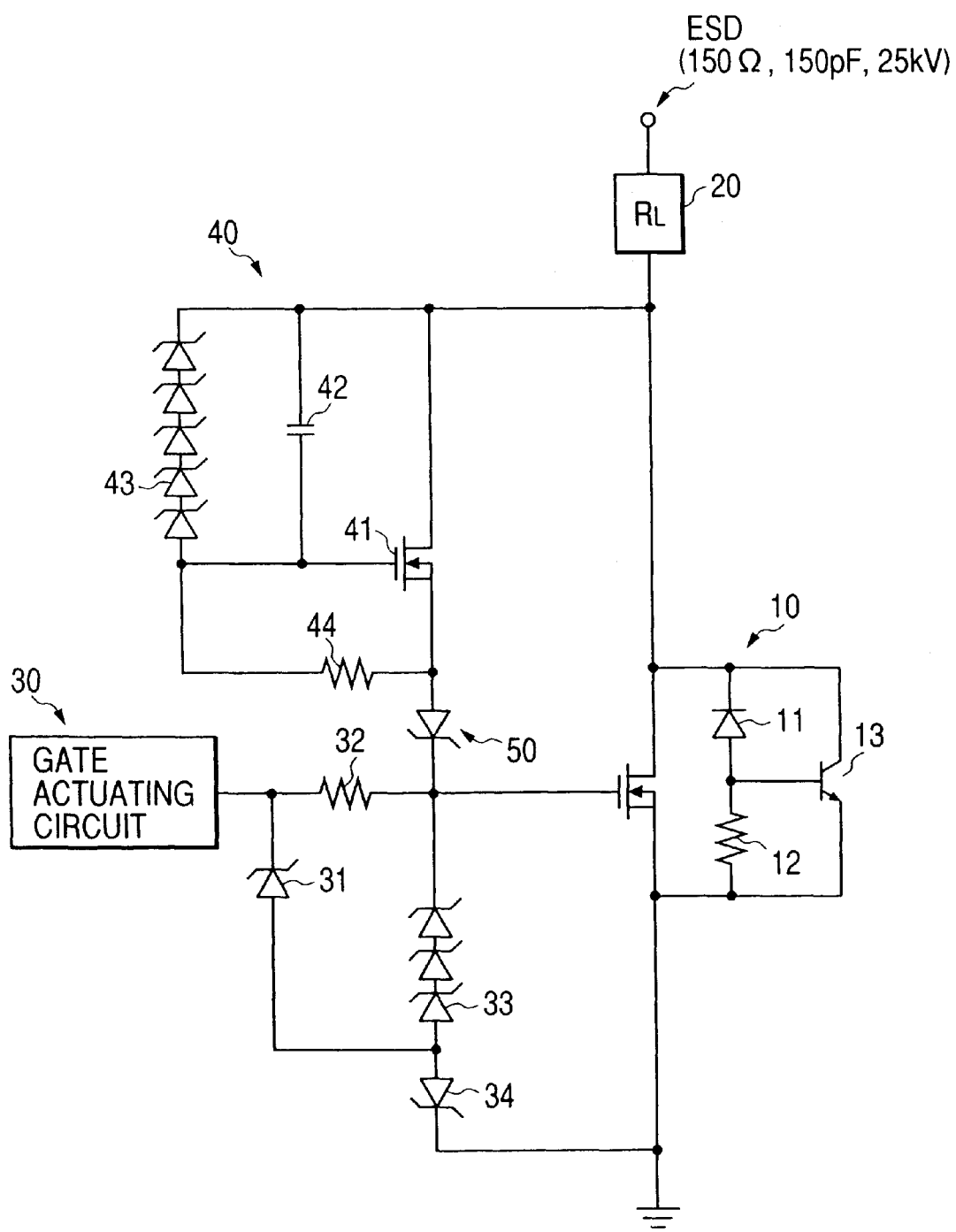
FIG. 1 is a circuit diagram showing an arrangement of a semiconductor device in accordance with a first embodiment of the present invention.

Preferred embodiment of the present invention will be explained hereinafter with reference to attached drawings. Identical parts are denoted by the same reference numerals throughout the views.

First Embodiment

FIG. 1 shows a semiconductor device in accordance with a first embodiment of the present invention. The semiconductor device includes a load actuating FET 10 which is a laterally double diffused MOS type (i.e., LDMOS). FET 10 has a drain electrode connected to an electric load 20.

FET 10 performs a switching function in response to a pulse voltage supplied from a gate actuating circuit 30. The pulse voltage is supplied to a gate electrode of FET 10 from the gate actuating circuit 30 via a Zener diode 31, a resister 32 (approximately 1 kΩ) and a serial circuit consisting of Zener diodes. The FET 10 is referred to as main FET.

FET 10, as shown in FIG. 1, includes an internal diode 11, an internal resister 12, and a parasitic transistor 13. The semiconductor device receives a surge, such as an ESD surge, from a terminal of the electric load 20.

Each of Zener diodes in the serial circuit 33 is formed by base and emitter electrodes of an NPN transistor. Each Zener diode has a withstand voltage of approximately 8V. The serial circuit 33 includes a total of three Zener diodes so that the sum of their withstand voltages does not exceed a withstand voltage of the gate oxide film of main FET 10. The Zener diode 31 has a function of clamping the pulse voltage of the gate actuating circuit 30 to an operation voltage. The withstand voltage of Zener diode 31 is equal to the gate actuating voltage (approximately 8V) of the main FET 10.

Part of the disclosed semiconductor device is a protecting apparatus comprising a protecting circuit 40 and a back-flow preventing Zener diode 50 connected between the gate and drain electrodes of the main FET 10.

The protecting circuit 40 includes a protective MOSFET (metal oxide semiconductor field-effect transistor 41 which has a drain electrode connected to the drain electrode of main FET 10. A source electrode of FET 41 is connected to the gate electrode of main FET 10 via the back-flow preventing Zener diode 50. Like main FET 10, the FET 41 includes an internal diode, an internal resister, and a parasitic transistor. The FET 41 is referred to as auxiliary FET.

Furthermore, the protecting circuit 40 includes a capacitor 42 connected between gate and drain electrodes of auxiliary FET 41. A serial circuit 43 consisting of Zener diodes is connected in parallel with the capacitor 42. The capacitor 42 is formed by an oxide film on a silicon substrate.

When an ESD surge is applied from the electric load 20, initial surge current caused based on this ESD surge flows through the capacitor 42. Next surge current succeeding the initial surge flows through the auxiliary FET 41. Late (or final) surge current included in the ESD surge flows through the serial circuit 43 of Zener diodes. A pull-down resistor 44, having a function of turning off the auxiliary FET 41, is connected between the gate and source electrodes of auxiliary FET 41.

The back-flow preventing Zener diode 50 has an anode connected to the source electrode of auxiliary FET 41 and a cathode connected to the gate electrode of main FET 10. The back-flow preventing Zener diode 50 functions as a means for preventing the current from flowing in a backward direction (i.e., from the gate electrode of FET 10 to the source electrode of auxiliary FET 41) when the main FET 10 turns on. The back-flow preventing Zener diode 50 has a withstand voltage larger than the gate actuating voltage (approximately 8V) of the main FFT 10. Zener diode 34 has a cathode connected to the ground and an anode connected to the anode of Zener diode 31 and also to the anode of the serial circuit 33. Zener diode 34, having a withstand voltage of approximately 100V, prevents any surge entering from the ground.

According to the circuit arrangement of the above-described first embodiment, when the semiconductor device receives an ESD surge applied from the electric load 20, an initial surge current caused based on this ESD surge flows through the capacitor 42 and then flows into the gate electrode of auxiliary FET 41. The area of auxiliary FET 41 is smaller than the area of main FET 10. The gate electrode of auxiliary FET 41 has a small input capacitance. Thus, the auxiliary FET 41 turns on within a very short time. The current flows through a small resister between the drain and source electrodes of auxiliary FET 41.

In response to the turning-on operation of auxiliary FET 41, next surge current based on the ESD surge and succeeding the initial surge current flows through the auxiliary FET 41 and then flows into the gate electrode of main FET 10 via the back-flow preventing Zener diode 50.

No resister is connected between the source electrode of auxiliary FET 41 and the gate electrode of main FET 10. Only the back-flow preventing Zener diode 50, having a very small internal resistance value, is connected between the source electrode of auxiliary FET 41 and the gate electrode of main FET 10.

Accordingly, the next surge current smoothly flows into the gate electrode of main FET 10 via the back-flow preventing Zener diode 50 without being reduced unexpectedly. In other words, the next surge current can serve as a charge current promptly and sufficiently flowing into the gate electrode of main FET 10.

Hence, in response to the next surge current, the main FET 10 turns on immediately without inducing the avalanche breakdown of the internal diode 11 or without activating the internal transistor 13.

Accordingly, the late surge current, which is caused based on the ESD surge and succeeds the next surge current, smoothly flows through the main FET 10.

As a result, it becomes possible to improve the ESD durability of the semiconductor device.

According to the above-described first embodiment, the capacitor 42 is connected between the drain and gate electrodes of auxiliary FET 41. When the next surge current flows into the drain electrode of auxiliary FET 41, part of the next surge current flows into the gate electrode of auxiliary FET 41 via the capacitor 42. Especially, the impedance of capacitor 42 becomes small against a rapid (i.e., high-speed in the order of nsec) surge, such as the ESD surge. Thus, a large amount of current flows through the capacitor 42.

Through the charging operation via the capacitor 42, the gate potential of auxiliary FET 41 exceeds a threshold value. The auxiliary FET 41 turns on. A large amount of surge current flows through the activated auxiliary FET 41. In general, when a capacitor and a Zener diode are identical in size, the impedance of the capacitor is smaller than that of the Zener diode against a rapid surge. Hence, the above-described circuit arrangement makes it possible to improve the ESD surge durability.

According to a conventional protecting circuit using a Zener diode, the Zener diode causes breakdown in response to an entered ESD surge prior to activation of the auxiliary FET 41. The conventional protecting circuit increases a gate potential of main FET 10 to a sufficiently higher level. In this case, the withstand voltage of the Zener diode needs to be fairly lower than that of the auxiliary FET 41. This leads to substantial reduction of the withstand voltage of the main FET 10. On the contrary, the protecting circuit of the first embodiment uses the capacitor 42 because the withstand voltage of the auxiliary FET 41 can be maintained at an adequate level.

Figure 2A:
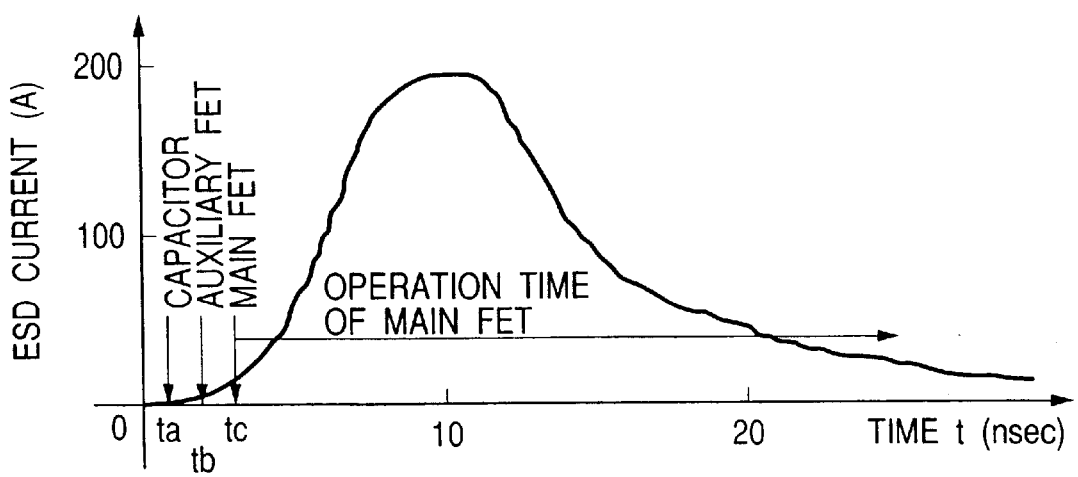
FIG. 2A is a time chart showing an ESD waveform and operation of the protecting circuit shown in FIG. 1.

FIG. 2A shows a waveform of an ESD surge and an operation of the protecting circuit for the semiconductor device of the first embodiment shown in FIG. 1. The waveform of the ESD surge builds up at a higher speed of several nsec to 10 nsec. The peak of the ESD current reaches 200 A.

In response to this ESD surge, the capacitor 42 starts its operation at time "ta" to allow the initial surge current to flow into the gate electrode of auxiliary FET 41. The auxiliary FET 41 starts its operation at time "tb" to allow the next surge current to flow into the gate electrode of main FET 10. The main FET 10 starts its operation at time "tc" to allow the late surge current to flow therethrough.

Figure 2B:
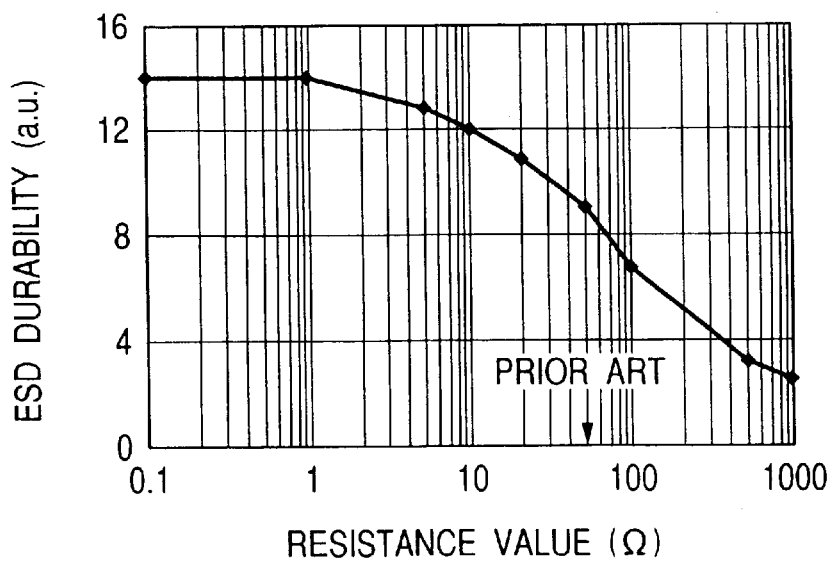
FIG. 2B is a graph showing relationship between ESD durability and Zener diode resistance in accordance with the first embodiment of the present invention.

FIG. 2B shows calculated result of the relationship between the ESD durability and a resistance value of Zener diode 50. The reduction of the ESD durability is checked by increasing the resistance value of the Zener diode 50.

As apparent from the graph of FIG. 2B, the ESD durability decreases with increasing resistance value. For example, the ESD durability decreases to a ½ level when the resistance value increases to 50Ω.

Accordingly, the first embodiment using no resister connected between the main FET 10 and the auxiliary FET 41 is advantageous in that the ESD durability can be maximized. In other words, the ESD durability is maintained at a maximum level.

When the semiconductor device receives a delayed surge which is slower than the ESD surge and suppled from the electric load 20, the Zener diodes in the serial circuit 43 cause breakdown. Thus, delayed surge current based on the delayed surge flows into the gate electrode of auxiliary FET 41 through the serial circuit 43. The auxiliary FET 41 turns on. In response to the turning-on of auxiliary FET 41, the main FET 41 turns on so as to allow the delayed surge current to flow the main FET 10. Thus, the semiconductor device can be protected against the delayed surge which is slower than the ESD.

As apparent from the foregoing description, the first embodiment provides a protecting apparatus for protecting a main transistor (10) formed on a semiconductor substrate from a rapid surge. The protecting apparatus comprises a back-flow preventing Zener diode (50) having a cathode connected directly to a control terminal of the main transistor (10) for preventing current from flowing in a predetermined direction. A protecting transistor (41) has an output terminal connected to an anode of the back-flow preventing Zener diode (50) and an input terminal connected to an input terminal of the main transistor (10). A protecting capacitor (42) is connected between a control terminal of the protecting transistor (41) and the input terminal of the main transistor (10) for allowing initial surge current, when caused based on a rapid surge, to flow into the control terminal of the protecting transistor (41). The protecting transistor (41), when turning on in response to the initial surge current, allows next surge current succeeding the initial surge current to flow into the control terminal of the main transistor (10) via the back-flow preventing Zener diode (50). The main transistor (10), when turning on in response to the next surge current, allows late surge current succeeding the next surge current to flow therethrough.

Second Embodiment

Figure 3:
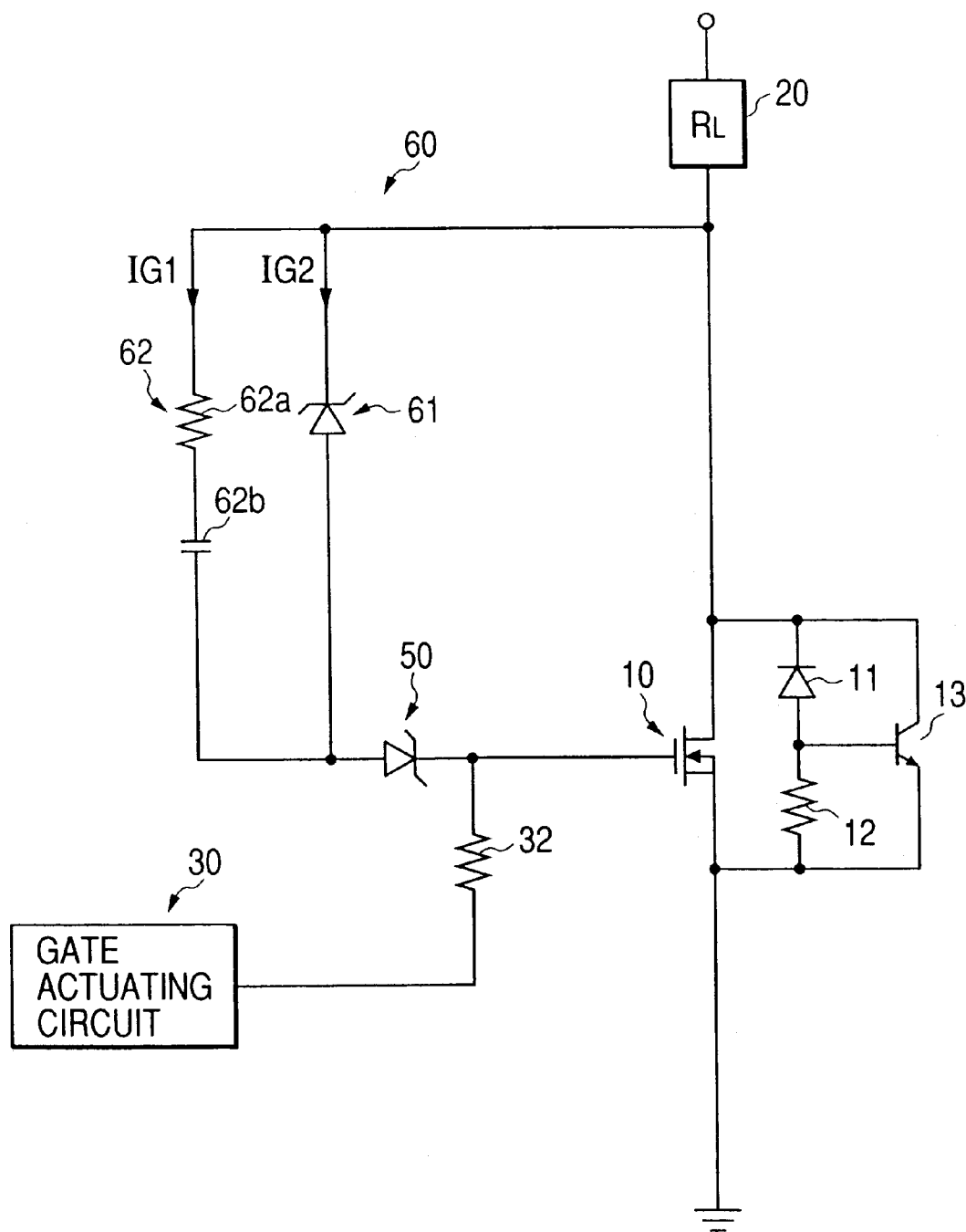
FIG. 3 is a circuit diagram showing an arrangement of a semiconductor device in accordance with a second embodiment of the present invention.

The second embodiment of the present invention is explained with reference to FIGS. 3 to 5.

The second embodiment discloses a protecting circuit 60 connected between the Zener diode 50 and the electric load 20.

The protecting circuit 60 comprises a Zener diode 61 and a serial circuit 62 connected in parallel with each other. The serial circuit 62 includes a capacitor 62b and a parasitic resister 62a of this capacitor 62b. The Zener diode 61 has a cathode connected to the drain electrode of main FET 10 and an anode connected to the gate electrode of main FET 10 via the back-flow preventing Zener diode 50. The arrangement of the main FET 10, the back-flow preventing Zener diode 50, the resister 32, and the gate actuating circuit 30 is substantially similar to that of the first embodiment.

According to the circuit arrangement of the second embodiment, when the semiconductor device receives an ESD surge applied from the electric load 20, the initial surge current caused based on this ESD surge flows through the serial circuit 62 and then flows into the gate electrode of main FET 10 via the back-flow Zener diode 50. Subsequently, the next surge current flows into the gate electrode of main FET 10 via the Zener diode 61 and the back-flow Zener diode 50.

No resister is connected between the anode of Zener diode 61 and the gate electrode of main FET 10. Only the back-flow preventing Zener diode 50, having a very small internal resistance value, is connected between the anode of Zener diode 61 and the gate electrode of main FET 10.

Accordingly, both the initial surge current flowing through the serial circuit 62 and the next surge current flowing through the Zener diode 61 smoothly flow into the gate electrode of main FET 10 via the back-flow preventing Zener diode 50 without being reduced unexpectedly. In other words, both the initial surge current and the next surge current can serve as successive charge currents promptly and sufficiently flowing into the gate electrode of main FET 10.

Hence, the main FET 10 turns on immediately without inducing the avalanche breakdown of the internal diode 11 or without activating the internal transistor 13. Accordingly, the late surge current, which is caused based on the ESD surge and succeeds the next surge current, smoothly flows through the main FET 10.

As a result, the second embodiment does not require the auxiliary FET 41 of the first embodiment. The ESD durability of the semiconductor device can be sufficiently assured by the cooperative or synergistic function of the Zener diode 61 and the serial circuit 62 comprising the capacitor 62b.

In this manner, the second embodiment provides a protecting apparatus for protecting a main transistor (10) formed on a semiconductor substrate from a rapid surge. The protecting apparatus comprises a back-flow preventing Zener diode (50) having a cathode connected to a control terminal of the main transistor (10) for preventing current from flowing in a predetermined direction. A protecting Zener diode (61) has an anode connected to an anode of the back-flow preventing Zener diode (50) and a cathode connected to an input terminal of the main transistor (10). A protecting capacitor (62b) is connected in parallel with the protecting Zener diode (61) for allowing initial surge current, when caused based on a rapid surge, to flow into the control terminal of the main transistor (10) via the back-flow preventing Zener diode (50). The protecting Zener diode (61) allows next surge current succeeding the initial surge current to flow into the control terminal of the main transistor (10) via the back-flow preventing Zener diode (50). The main transistor (10), when turning on in response to the initial surge current or the next surge current, allows late surge current succeeding the next surge current to flow therethrough.

Figure 4:
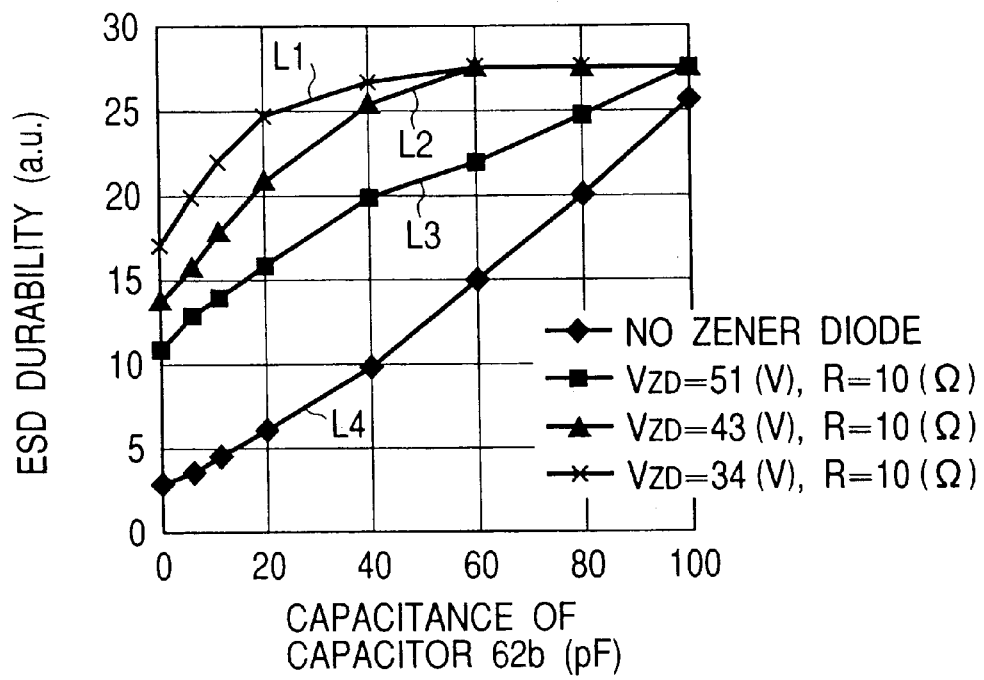
FIG. 4 is a graph showing relationship between ESD durability and capacitance value in accordance with a second embodiment of the present invention.

FIG. 4 shows the relationship between the ESD durability and the capacitance of capacitor 62b of the semiconductor device in accordance with the second embodiment of the present invention. Line L1 is a characteristic curve obtained when a Zener diode voltage $V_{ZD}$ of Zener diode 61 is 34V and a resistance value R of the parasitic resister 62a is 10Ω. Line L2 is a characteristic curve obtained when the Zener diode voltage $V_{ZD}$ is 43V and the resistance value R is 10Ω. Line L3 is a characteristic curve obtained when the Zener diode voltage $V_{ZD}$ is 51V and the resistance value R is 10Ω. Line L4 is a characteristic curve obtained when the Zener diode 61 is omitted.

The ESD durability corresponding to a same capacitance of the capacitor 62b decreases in the order of lines L1 to L4. Meanwhile, the ESD durability increases with increasing capacitance of the capacitor 62b on each characteristic curve.

Figure 5:
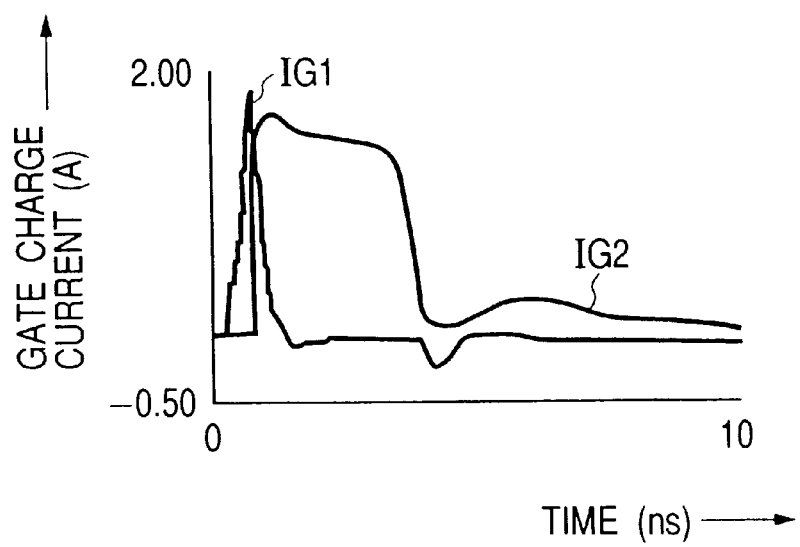
FIG. 5 is a graph showing variation of gate charge current in accordance with the second embodiment of the present invention.

In FIG. 5, lines IG1 and IG2 represent variations of the initial surge current and the next surge current in the condition that the capacitance of capacitor 62b is 20 pF, the resistance value R is 5Ω and Zener diode voltage $V_{ZD}$ is 34V.

Third Embodiment

Figure 6:
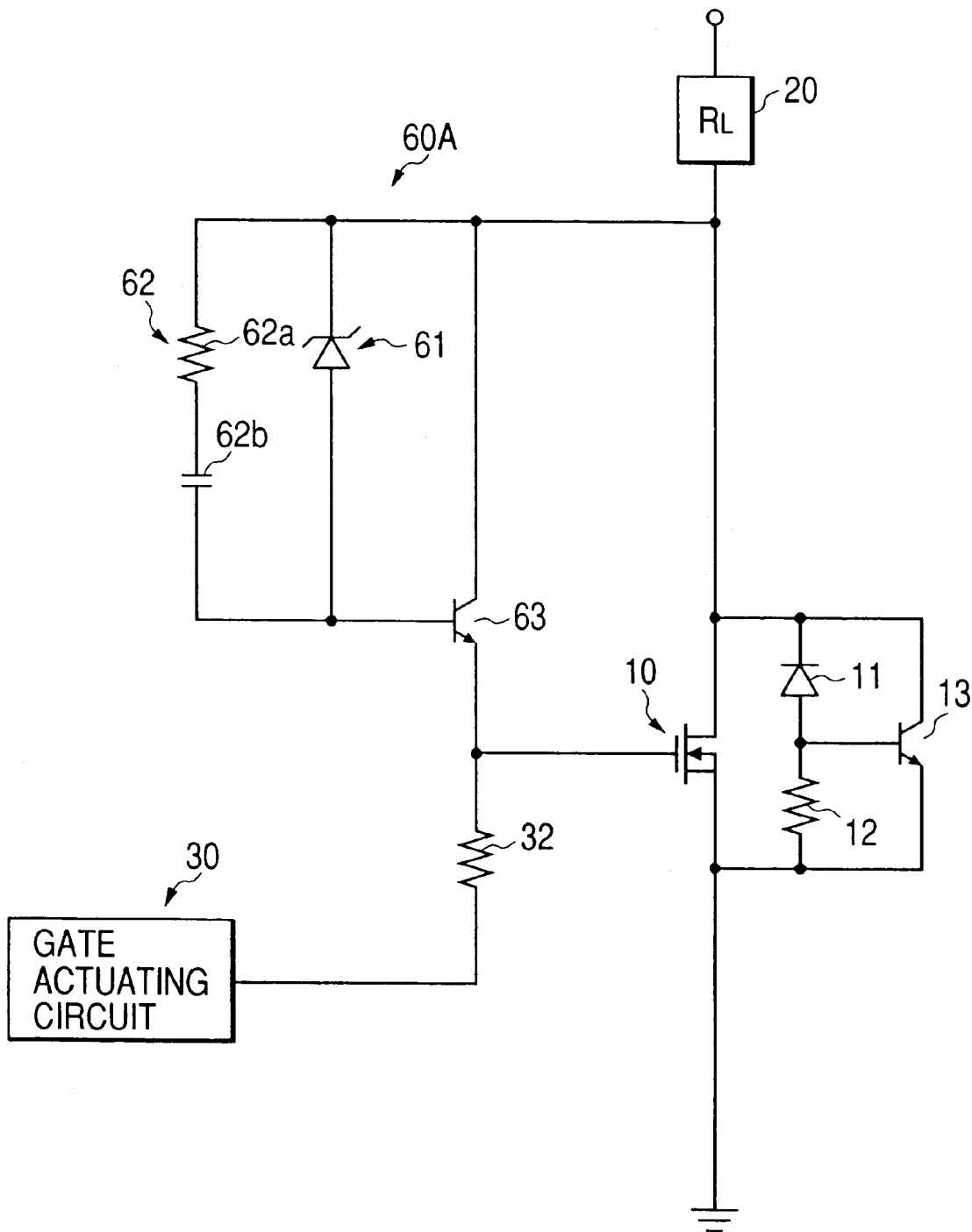
FIG. 6 is a circuit diagram showing an arrangement of a semiconductor device in accordance with a third embodiment of the present invention.

FIG. 6 shows a semiconductor device in accordance with a third embodiment of the present invention, which includes a protecting circuit 60A. The protecting circuit 60A comprises a bipolar transistor 63 instead of using the MOSFET 41 and the Zener diode 50. The bipolar transistor 63 has a collector electrode connected to the drain electrode of main FET 10 and an emitter electrode connected to the gate electrode of main FET 10. The base electrode of bipolar transistor 63 is connected to the collector electrode of bipolar transistor 63 via a serial circuit of the Zener diode 61 and the serial circuit 62. The arrangement of the main FET 10, the resister 32, and the gate actuating circuit 30 is substantially similar to that of the first embodiment.

According to the circuit arrangement of the third embodiment, when the semiconductor device receives an ESD surge applied from the electric load 20, the initial surge current caused based on this ESD surge flows through the serial circuit 62 and then flows into the base electrode of bipolar transistor 63. Subsequently, the next surge current flows into the base electrode of bipolar transistor 63 via the Zener diode 61. In response to the input current, the bipolar transistor 63 turns on.

The next surge current flows through the bipolar transistor 63 and directly enters, as charge current, into the gate electrode of main FET 10.

In this case, as the bipolar transistor 63 has current amplification function, the charging of the gate electrode of main FET 10 is quickly accomplished.

Hence, the main FET 10 turns on immediately without inducing the avalanche breakdown of the internal diode 11 or without activating the internal transistor 13. Accordingly, the late surge current, which is caused based on the ESD surge and succeeds the next surge current, smoothly flows through the main FET 10.

As a result, the third embodiment does not require the auxiliary FET 41 of the first embodiment. The ESD durability of the semiconductor device can be sufficiently assured by the cooperative or synergistic function of the Zener diode 61 and the serial circuit 62 and also by employment of the bipolar transistor 63.

According to the third embodiment, the portion between emitter and base electrodes of the bipolar transistor 63 is functionally equivalent to the back-flow preventing Zener diode 50. In other words, the bipolar transistor 63 includes a built-in (or internal) Zener diode equivalent to the back-flow preventing Zener diode 50. Hence, the back-flow preventing Zener diode 50 can be removed. The total number of components in the semiconductor circuit can be reduced.

As apparent from the foregoing description, the third embodiment provides a protecting apparatus for protecting a main transistor (10) formed on a semiconductor substrate from a rapid surge. The protecting apparatus comprises a protecting transistor (63) having an output terminal connected to a control terminal of the main transistor (10) and an input terminal connected to an input terminal of the main transistor (10). The protecting transistor (63) comprises a built-in back-flow preventing Zener diode. A protecting capacitor (62b) is connected between a control terminal of the protecting transistor (63) and the input terminal of the main transistor (10) for allowing initial surge current, when caused based on a rapid surge, to flow into the control terminal of the protecting transistor (63). The protecting transistor (63), when turning on in response to the initial surge current, allows next surge current succeeding the initial surge current to flow into the control terminal of the main transistor (10). And, the main transistor (10), when turning on in response to the next surge current, allows late surge current succeeding the next surge current to flow therethrough.

Figure 23:
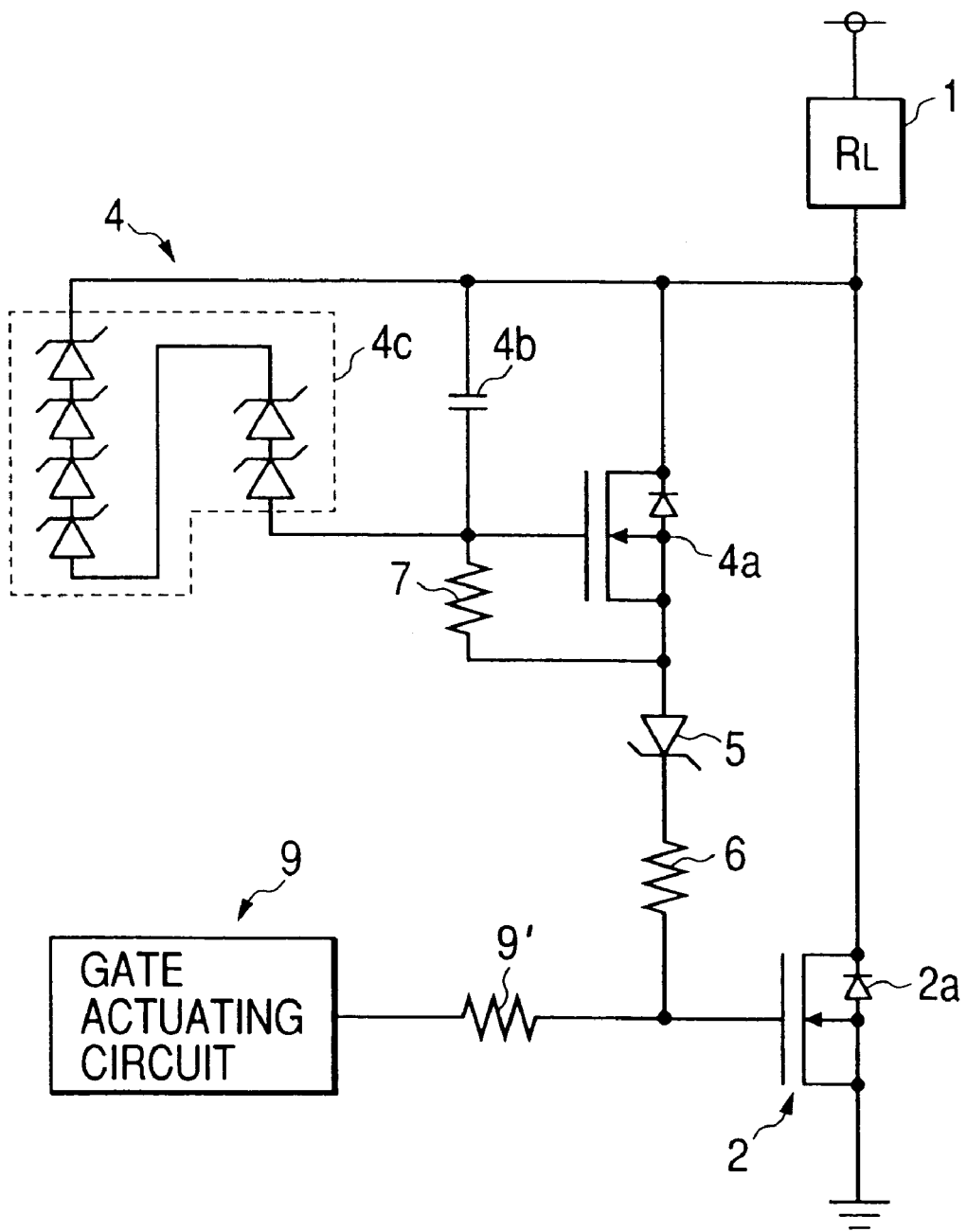
FIG. 23 is a circuit diagram showing an arrangement of another conventional semiconductor device.

The function and effect of the third embodiment can be explained in comparison with the protecting apparatus of the Unexamined Japanese patent publication No.8-64812 shown in FIG. 23. According to the circuit arrangement shown in FIG. 23, the FET 4a is connected between the gate and drain electrodes of FET 2. A gate actuating circuit 9 biases the gate electrode of FET 2 via a resister 9' to turn on FET 2. In this case, it is necessary to prevent the current from flowing in a backward direction along the path of gate actuating circuit 9→FET 4a→drain of FET 2. Thus, the back-flow preventing Zener diode 5 is inevitably required between the gate electrode of FET 2 and the source electrode of FET 4a.

However, the back-flow preventing Zener diode 5 inherently includes an internal parasitic resister. If required to reduce the parasitic resistance value, the size of Zener diode 5 will increase and correspondingly the cost will rise. Needless to say, the parasitic resistance value increases when the Zener diode is downsized. This will restrict or reduce the gate charge current of FET 2 undesirably when the ESD surge is applied.

Such problems in the protecting apparatus of the Unexamined Japanese patent publication No.8-64812 can be solved by employing the bipolar transistor 63 disclosed in the above-described third embodiment.

Fourth Embodiment

Figure 7:
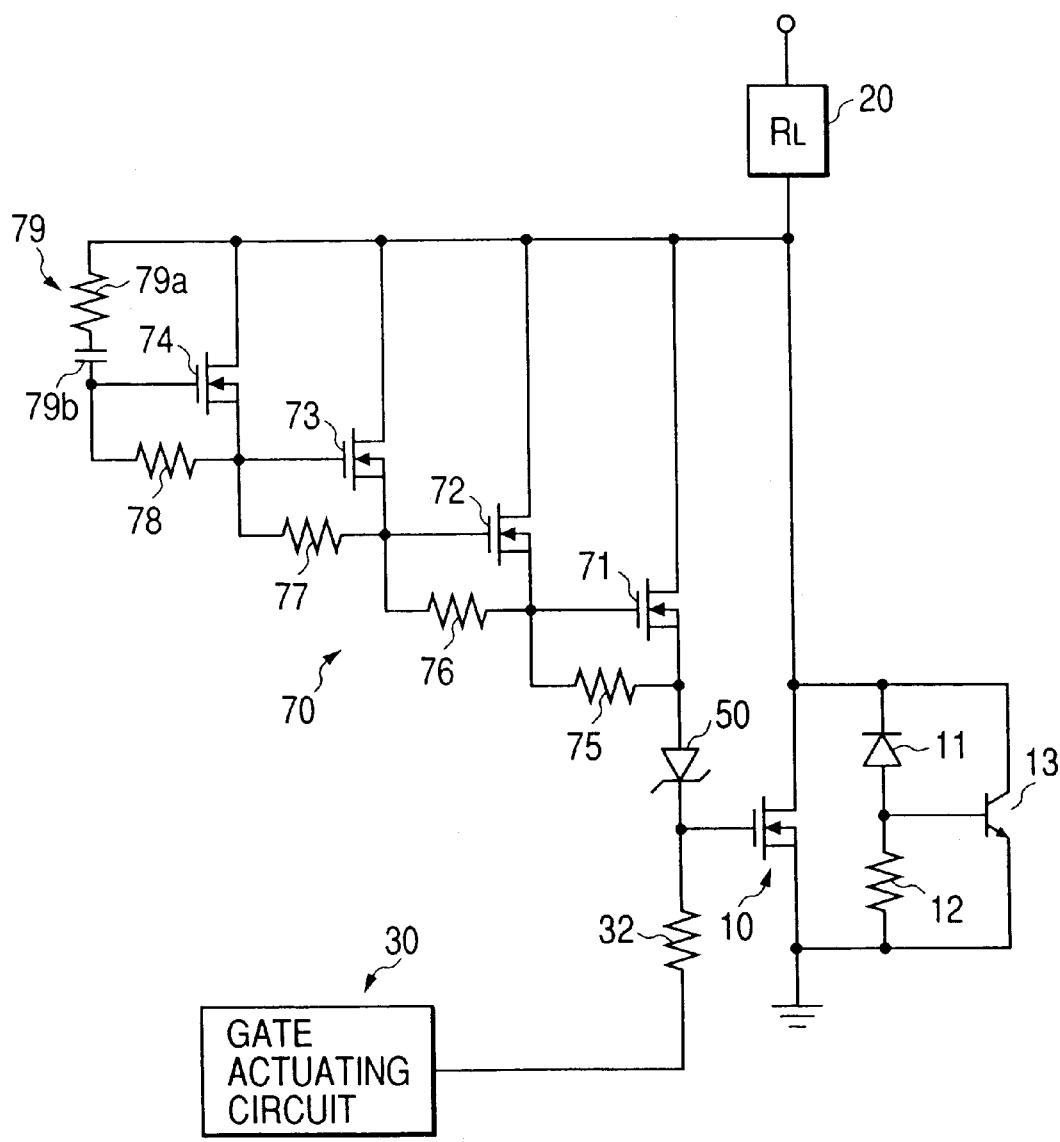
FIG. 7 is a circuit diagram showing an arrangement of a semiconductor device in accordance with a fourth embodiment of the present invention.

FIG. 7 shows a semiconductor device in accordance with a fourth embodiment of the present invention, which includes a protecting circuit 70.

The protecting circuit 70 includes a total of four LDMOS-type FETs 71 to 74 which are connected in a Darlington connecting pattern. FET 71 has a drain electrode connected to the drain of main FET 10 and a source electrode connected to the gate electrode of main FET 10 via the back-floe preventing Zener diode 50.

Each drain electrode of other FETs 72 to 74 is connected to the drain electrode of FET 71. FET 72 has a source electrode connected to a gate electrode of FET 71. FET 73 has a source electrode connected to a gate electrode of FET 72. FET 74 has a source electrode connected to a gate electrode of FET 73.

A resister 75 is connected between the gate and source electrodes of FET 71. A resister 76 is connected between the gate and source electrodes of FET 72. A resister 77 is connected between the gate and source electrodes of FET 73. A resister 78 is connected between the gate and source electrodes of FET 74. A serial circuit 79, consisting of a capacitor 79b and a resister 79a, is connected between the gate and drain electrodes of FET 74. The arrangement of the main FET 10, the back-flow preventing Zener diode 50, the resister 32, and the gate actuating circuit 30 is substantially similar to that of the first embodiment.

According to the circuit arrangement of the fourth embodiment, when the semiconductor device receives an ESD surge from the electric load 20, the initial surge current flows into the gate electrode of FET 74 via the serial circuit 79. FET 74 turns on in response to the initial surge current. Then, the initial surge current flows into the gate electrode of FET 73 via FET 74 so as to turn on FET 73. Then, the initial surge current flows into the gate electrode of FET 72 via FET 73 so as to turn on FET 72. Then, the initial surge current flows into the gate electrode of FET 71 via FET 72 so as to turn on FET 71.

When FET 71 turns on, the next surge current flows into the gate electrode of main FET 10 via the FET 71 and the back-flow preventing Zener diode 50.

FETs 71 to 74 have a large amplification function as they are connected in the Darlington connecting pattern of four stages. No resister is connected between the source electrode of FET 71 and the gate electrode of main FET 10. Only the back-flow preventing Zener diode 50, having a very small internal resistance value, is connected between the source electrode of FET 71 and the gate electrode of main FET 10.

Accordingly, the next surge current flowing through the FET 71 smoothly flow into the gate electrode of main FET 10 via the back-flow preventing Zener diode 50 without being reduced unexpectedly. In other words, the next surge current can serve as charge current promptly and sufficiently flowing into the gate electrode of main FET 10.

Hence, the main FET 10 turns on immediately without inducing the avalanche breakdown of the internal diode 11 or without activating the internal transistor 13. Accordingly, the late surge current, which is caused based on the ESD surge and succeeds the next surge current, smoothly flows through the main FET 10.

As a result, the ESD durability of the semiconductor device can be sufficiently assured.

The delayed surge current caused based on the delayed surge slower than the ESD surge flows through each of the FETs 74 to 71 and the main FET 10.

As apparent from the above description, the Zener diode serial circuit 43 and the capacitor 42 disclosed in the first embodiment or the serial circuit 62 and the Zener diode 61 can be replaced by the three-stage of FETs 74 to 72 disclosed in the forth embodiment.

As apparent from the foregoing description, the fourth embodiment provides a protecting apparatus for protecting a main transistor (10) formed on a semiconductor substrate from a rapid surge. The protecting apparatus comprises a back-flow preventing Zener diode (50) having a cathode connected to a control terminal of the main transistor (10) for preventing current from flowing in a predetermined direction. A protecting transistor circuit (70) includes a plurality of transistors (71 to 74) consisting of an initial transistor and at least one succeeding transistor connected in a Darlington connecting pattern, each transistor having an output terminal connected to an anode of the back-flow preventing Zener diode (50) and an input terminal connected to an input terminal of the main transistor (10). The protecting transistor circuit (70) turns on the succeeding transistor in response to initial surge current caused based on a rapid surge, and further turns on the initial transistor (71) in response to the turning of the succeeding transistor (72–74). The initial transistor (71), when turning on, allows next surge current succeeding the initial surge current to flow into the control terminal of the main transistor (10). The main transistor (10), when turning on in response to the next surge current, allows late surge current succeeding the next surge current to flow therethrough.

Figure 8:
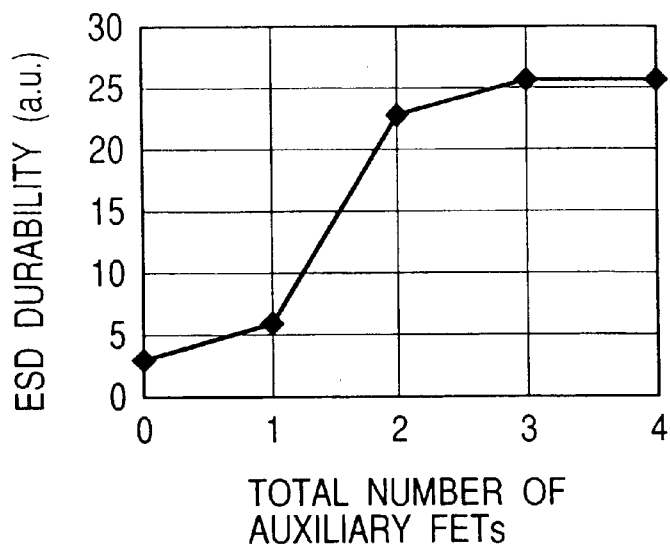
FIG. 8 is a graph showing relationship between ESD durability and total number of FETs in accordance with the fourth embodiment.

FIG. 8 is a graph of calculated result showing the relationship between the ESD durability and the total number of FETs in the protecting circuit 70 in accordance with the fourth embodiment. As apparent from FIG. 8, the ESD durability increases with increasing number of FETs. In other words, the ESD durability is improved with increasing number of FETs. Especially, a steep increase of ESD durability is recognized during the change from one FET to two FETs. However, regardless of increase of the number of FETs to three or four stages, the ESD durability is substantially saturated to a constant value.

Fifth Embodiment

Figure 9:
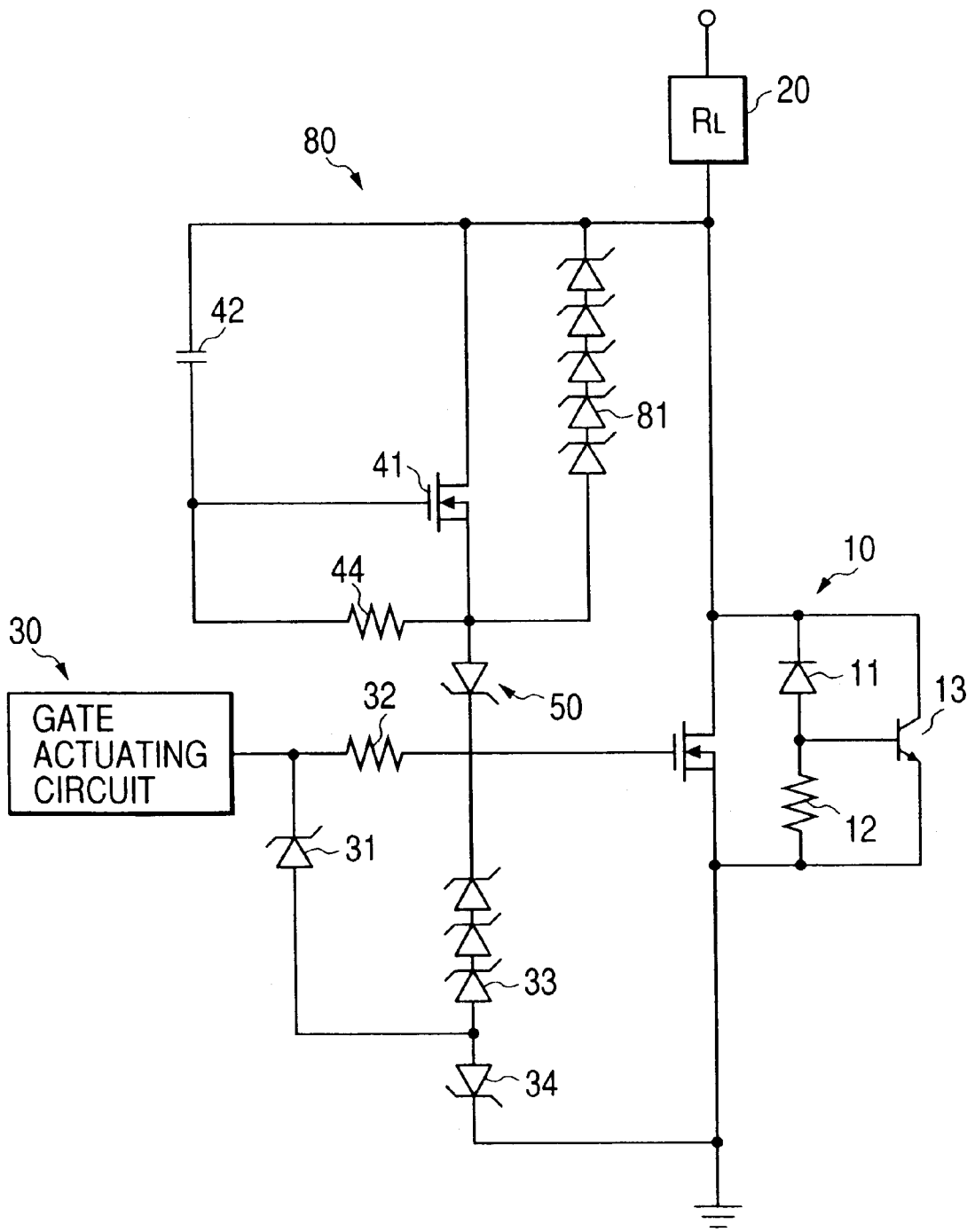
FIG. 9 is a circuit diagram showing an arrangement of a semiconductor device in accordance with a fifth embodiment of the present invention.

FIG. 9 shows a semiconductor device in accordance with a fifth embodiment of the present invention. The circuit arrangement of the fifth embodiment differs from that of the first embodiment in that the protecting circuit 40 is replaced by a protecting circuit 80. The protecting circuit 80 removes the Zener diode serial circuit 43 of the protecting circuit 80 but includes a protective Zener diode circuit 81 connected between the source and drain electrodes of the auxiliary FET 41.

The protecting circuit 80, including the capacitor 42 and the auxiliary FET 41, has function of protecting the semiconductor device from the ESD surge. The ESD surge has a very fast speed in the range of several tens nsec. The frequency of the ESD surge is in the order of GHz.

To absorb such rapid surge by the main FET 10, the auxiliary FET 41 must operate quickly. To this end, a required capacitance of capacitor 42 is approximately 20 pF so that the high-frequency surge current can quickly flow into the gate electrode of the auxiliary FET 41.

However, such a small capacitance is not effective against a load surge, e.g., an L (inductive) load surge caused when electric power supply to an inductive load is stopped, having a slow speed ($\mu$sec) and a low frequency (kHz). Such a slow load surge rises before it operates the auxiliary FET 41 via the capacitor 42. Hence, the main FET 10 may be broken due to its internal parasitic transistor. The capacitor is weak against the low frequency surge.

In view of the above, the protecting circuit 80 comprises a protective Zener diode circuit 81 connected in parallel with the auxiliary FET 41. According to this circuit arrangement, the protective Zener diode circuit 81 causes the L (inductive) load surge to flow into the gate electrode of FET 10. The main FET 10 operates before the L load surge rises. Thus, the main FET 10 absorbs the L load surge.

This invention assumes that the ESD surge is caused under the discharge condition of 150Ω and 150 pF. The caused ESD surge has approximately 25 kV and 200 A, with the frequency in the range of GHz. The ESD surge continues for several 10 nsec. On the other hand, the L load surge is supposed to have 3 A and 60 V, with the frequency of approximately 100 kHz.

The following is the condition for the main FET 10 to sufficiently absorb the L load surge.

Rd>Rh where Rh represents an operation resistance of the protecting section including the protecting circuit 80 and the Zener diode 50 with respect to the gate electrode of main FET 10, and Rd represents the gate actuating resister 32.

When the Zener diode 50 causes breakdown in response to the L load surge, current flows into the gate actuating resister 32. However, when the above condition is satisfied, the gate actuating resister 32 can assure a sufficiently voltage drop (e.g., three times the threshold voltage Vth) to actuate the main FET 10.

Furthermore, to surely absorb the ESD surge by the main FET 10, the above condition Rd>Rh needs to be established because the voltage drop caused at the actuating resister 32 in response to the next surge current flowing from the auxiliary FET 41 to the control terminal of main FET 10 becomes larger than the threshold value.

In this manner, the fifth embodiment provides a protecting Zener diode (81) connected in parallel with the protecting transistor (41). The protecting Zener diode (81) has a cathode connected to the input terminal of the main transistor (10) and an anode connected to the anode of the back-flow preventing Zener diode (50). The main transistor (10) controls current supplied to a load (20) connected to the input terminal of the main transistor (10). The load (20) generates a load surge when the current supply is stopped. The rapid surge is caused by an electrostatic discharge. The load surge is small in frequency than the rapid surge. The load surge has a frequency in the range of kHz, while the rapid surge has a frequency in the range of GHz. The protecting Zener diode (81) causes breakdown in response to the load surge so as to turn on the main transistor (10) prior to a turning-on operation of the protecting transistor (41) by the protecting capacitor (42).

The relationship Rd>Rh is satisfied, where Rh represents an operation resistance in a flowing path of the next surge current flowing into the control terminal of the main transistor via the back-flow preventing Zener diode, and Rd represents an actuating resistance disposed in a path connected to an actuating circuit for actuating the main transistor.

Sixth Embodiment

Figure 10:
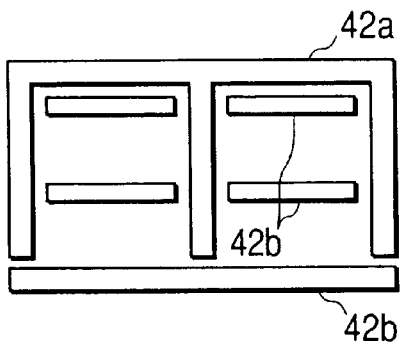
FIG. 10 is a plan view showing an improved capacitor in accordance with a sixth embodiment of the present invention.
Figure 11:
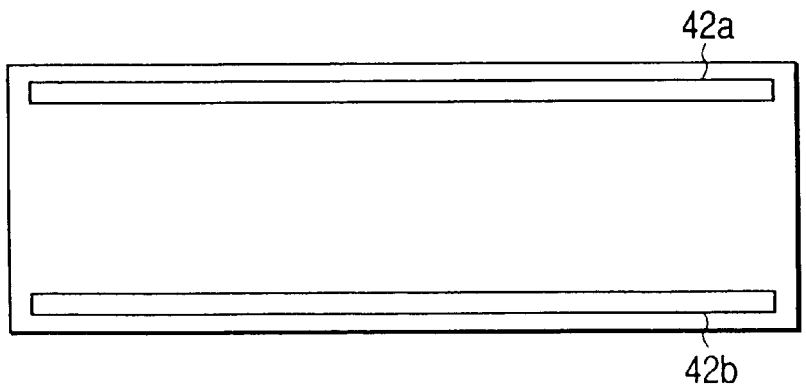
FIG. 11 is a plan view showing a conventional capacitor.

FIG. 10 shows a sixth embodiment of the present invention. The sixth embodiment shows a preferable layout of the capacitor 42 disclosed in the first embodiment. FIG. 10 shows a plan view of the capacitor 42 which includes one electrode (formed by a deep n$^+$ diffused layer) and the other electrode (formed by a polysilicon). The contact 42a for one electrode and the contact 42b for the other electrode are provided lots compared with a conventional arrangement shown in FIG. 11.

This arrangement is advantageous in that the parasitic serial resistance of the capacitor 42 can be reduced. As a result, the function and effect of the capacitor 42 shown in FIG. 1 can be enhanced.

Seventh Embodiment

Figure 12A:
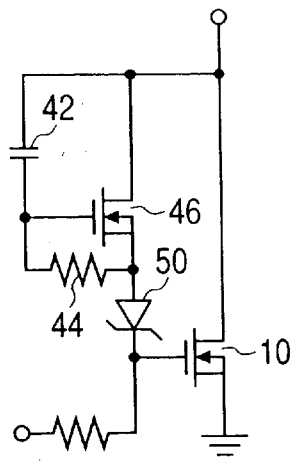
FIG. 12A is a circuit diagram showing an arrangement of a semiconductor device in accordance with a seventh embodiment of the present invention.

FIG. 12A shows a semiconductor device in accordance with a seventh embodiment of the present invention. The seventh embodiment shows a modified circuit arrangement of the first embodiment. The resister 44 is connected between a gate electrode of FET 46 and the gate electrode of FET 10. FET 46 is functionally equivalent to FET 41 shown in FIG. 1.

According to the circuit arrangement of the seventh embodiment, the initial surge current flows into the gate electrode of FET 46 via the capacitor 42. When the gate electrode of FET 46 is charged to a level higher than the gate threshold potential, FET 46 turns on. Subsequently, current flows into the gate electrode of FET 10 which is connected to the source electrode of FET 46 via the Zener diode 50. When the gate potential of FET 10 exceeds the threshold level, FET 10 turns on. A sufficient amount of surge current flows through the activated FET 10. It suppresses operation of the parasitic bipolar transistor in the FET 10. The ESD surge durability can be improved.

The resister 44 serves as a pull-down resister for the FET 46, so as to discharge the gate charge of FET 46 to turn off FET 46.

Accordingly, the seventh embodiment provides a protecting apparatus for protecting a main transistor (10) formed on a semiconductor substrate from a rapid surge. The protecting apparatus comprises a back-flow preventing Zener diode (50) having a cathode connected directly to a control terminal of the main transistor (10) for preventing current from flowing in a predetermined direction. A protecting transistor (46) has an output terminal connected to an anode of the back-flow preventing Zener diode (50) and an input terminal connected to an input terminal of the main transistor (10). A protecting capacitor (42) is connected between a control terminal of the protecting transistor (46) and the input terminal of the main transistor (10) for allowing initial surge current, when caused based on a rapid surge, to flow into the control terminal of the protecting transistor (46). The protecting transistor (46), when turning on in response to the initial surge current, allows next surge current succeeding the initial surge current to flow into the control terminal of the main transistor (10) via the back-flow preventing Zener diode (50). And, the main transistor (10), when turning on in response to the next surge current, allows late surge current succeeding the next surge current to flow therethrough.

Figure 13A:
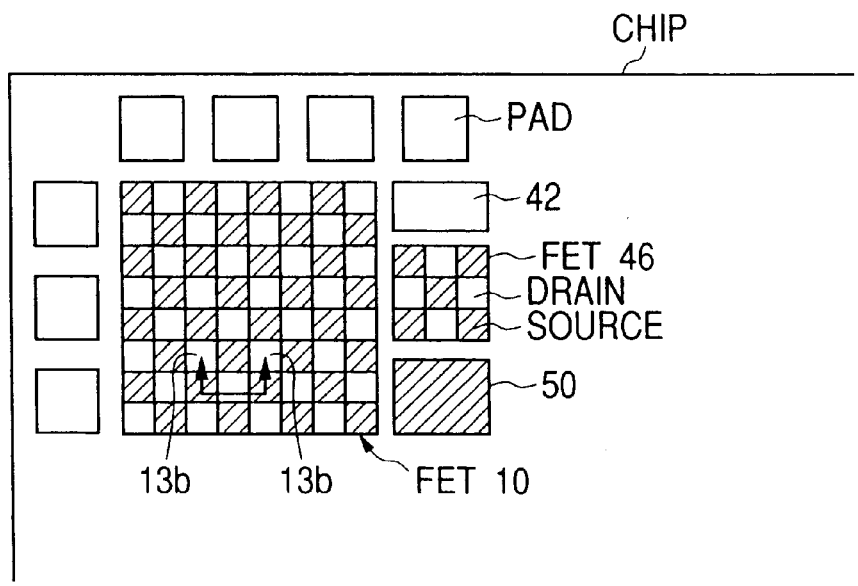
FIG. 13A is a partial plan view showing the semiconductor device in accordance with the seventh embodiment of the present invention.
Figure 13B:
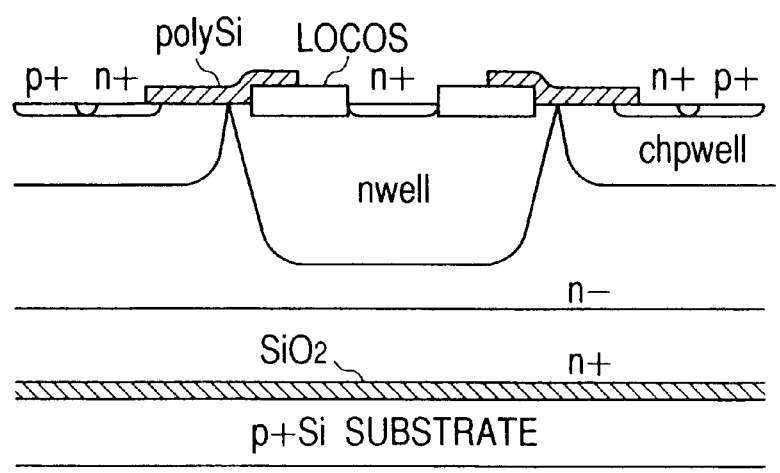
FIG. 13B is a cross-sectional view showing the semiconductor device in accordance with the seventh embodiment of the present invention, taken along a line 13b—13b of FIG. 13A.

FIGS. 13A and 13B are plan and cross-sectional views showing the FETs 10 and 46 of the seventh embodiment. The FETs 10 and 46 can be formed in the same manufacturing process.

Figure 12B:
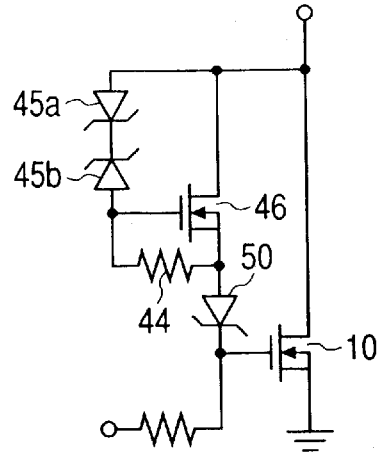
FIG. 12B is a circuit diagram showing an arrangement of a modified semiconductor device in accordance with the seventh embodiment of the present invention.

FIG. 12B shows a modification of the seventh embodiment. In this modified embodiment, the capacitor 42 is replaced by Zener diodes 45a and 45b which are serial connected so as to have opposite polarities and interposed between the gate and drain electrodes of FET 46. Zener diode 45a has an anode connected to the drain electrode of FET 46. Zener diode 45b has an anode connected to the gate electrode of FET 46. The cathode of Zener diode 45a is directly connected to the cathode of Zener diode 45b.

According to this circuit arrangement, Zener diodes 45a and 45b cause breakdown in response to the initial surge current. The initial surge current flows into the gate electrode of FET 46. In response to the charging of the gate electrode, the FET 46 turns on. In response to the turning-on operation, the gate electrode of main FET 10 is charged. When the FET 10 turns on, the late surge current flows through the main FET 10.

Thus, the seventh embodiment of the present invention provides another protecting apparatus for protecting a main transistor (10) formed on a semiconductor substrate from a rapid surge. The protecting apparatus comprises a back-flow preventing Zener diode (50) having a cathode connected directly to a control terminal of the main transistor (10) for preventing current from flowing in a predetermined direction. A protecting transistor (46) has an output terminal connected to an anode of the back-flow preventing Zener diode (50) and an input terminal connected to an input terminal of the main transistor (10). A Zener diode circuit (45a, 45b) connected between a control terminal of the protecting transistor (46) and the input terminal of the main transistor (10) for allowing ;initial surge current, when caused based on a rapid surge, to flow into the control terminal of the protecting transistor (46). The protecting transistor (46), when turning on in response to the initial surge current, allows next surge current succeeding the initial surge current to flow into the control terminal of the main transistor (10) via the back-flow preventing Zener diode (550). And, the main transistor (10), when turning on in response to the next surge current, allows late surge current succeeding the next surge current to flow therethrough.

Eighth Embodiment

Figure 14:
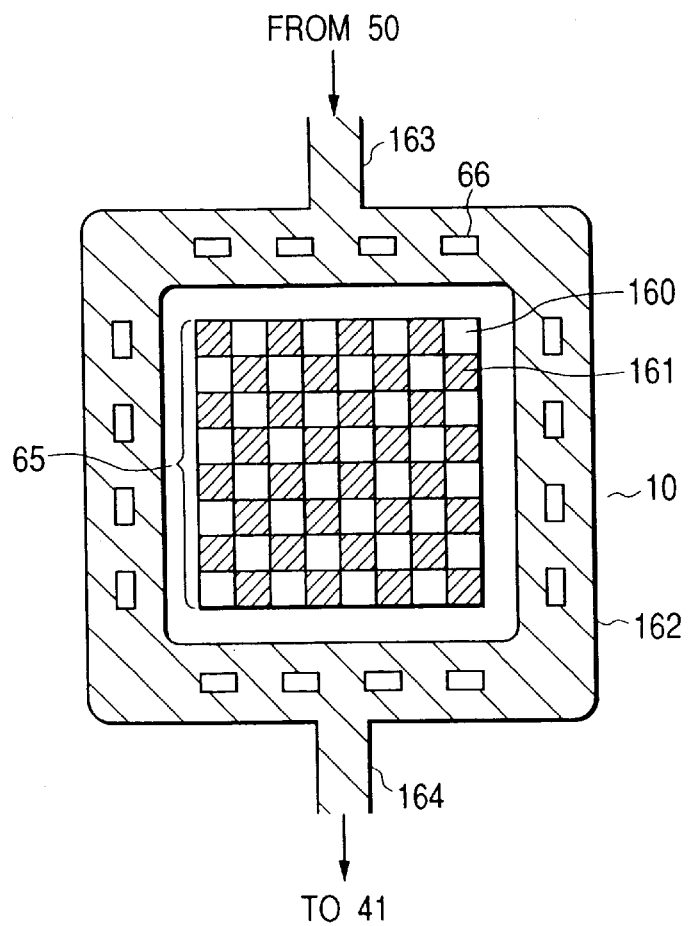
FIG. 14 is a plan view showing a print pattern of the main FET formed on a semiconductor substrate in accordance with an eighth embodiment of the present invention.

FIG. 14 shows a print pattern of the main FET 10 formed on a semiconductor substrate in accordance with an eighth embodiment of the present invention. The main FET 10 includes a cell region 65 consisting of a plurality of single cells arranged in a matrix pattern on the surface of the semiconductor substrate. Each signal cell comprises a drain 160 and a source 161. An aluminum gate leader line 162 is formed as a wiring pattern on the surface of the semiconductor substrate so as to surround the cell region 65.

The aluminum gate leader line 162 is insulated from a polysilicon layer serving as the gate electrode by an insulating film interposed therebetween. The aluminum gate leader line 162 is connected to the polysilicon layer (i.e., gate electrode of each single cell) via a gate polysilicon contact 66. A wiring width of the aluminum gate leader line 162 is wider than that of a lead 163 connected to the Zener diode 50 or that of a lead 164 connected to the source electrode of FET 41. With this arrangement, it becomes possible to promptly activate the main FET 10 in response to the ESD surge or the L load surge.

Ninth Embodiment

Figure 15A:
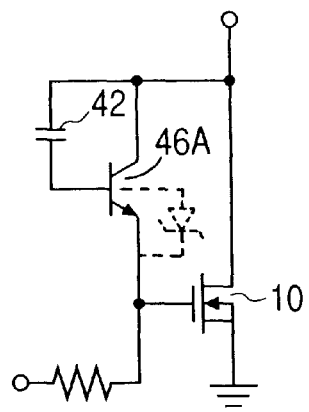
FIG. 15A is a circuit diagram showing an arrangement of a semiconductor device in accordance with a ninth embodiment of the present invention.

FIG. 15A shows a semiconductor device in accordance with a ninth embodiment of the present invention. The ninth embodiment differs from the seventh embodiment (refer to FIG. 12A) in that the FET 46 and the Zener diode 50 are replaced by a bipolar transistor 46A.

The bipolar transistor 46A has an emitter electrode connected to the gate electrode of main FET 10 and a collector electrode connected to the drain electrode of main FET 10. The base electrode of the bipolar transistor 46A is connected to the collector electrode of the bipolar transistor 46A via the capacitor 42.

According to the circuit arrangement of the ninth embodiment, the next surge current flows into a base electrode of bipolar transistor 46A via the capacitor 42. In response to this current flowing into the base electrode, the bipolar transistor 46A including a base-emitter junction capacitor is charged. When the base potential of bipolar transistor 46A exceeds a diffusion potential (approximately 0.6 V), the bipolar transistor 46A turns on. Subsequently, the next surge current flows into the gate electrode of main FET 10 which is connected to the emitter electrode of bipolar transistor 46A. When the gate potential of main FET 10 exceeds a threshold value, the main FET 10 turns on. Thus, a sufficient amount of late surge current flows through the activated main FET 10.

Namely, the late surge current flows through the main FET 10 in response to the turning-on operation of the main FET 10. It suppresses operation of the parasitic bipolar transistor in the main FET 10. The ESD surge durability can be improved.

Thus, the ninth embodiment provides a protecting apparatus for protecting a main transistor (10) formed on a semiconductor substrate from a rapid surge. The protecting apparatus comprises a protecting transistor (46A) having an output terminal connected to a control terminal of the main transistor (10) and an input terminal connected to an input terminal of the main transistor (10). The protecting transistor (46A) comprises a built-in back-flow preventing Zener diode. A protecting capacitor (42) is connected between a control terminal of the protecting transistor (46A) and the input terminal of the main transistor (10) for allowing initial surge current, when caused based on a rapid surge, to flow into the control terminal of the protecting transistor (46A). The protecting transistor (46A), when turning on in response to the initial surge current, allows next surge current succeeding the initial surge current to flow into the control terminal of the main transistor (10). The main transistor (10), when turning on in response to the next surge current, allows late surge current succeeding the next surge current to flow therethrough.

Figure 15B:
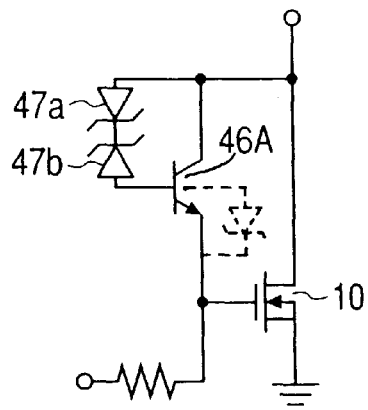
FIG. 15B is a circuit diagram showing an arrangement of a modified semiconductor device in accordance with the ninth embodiment of the present invention.

FIG. 15B shows a modification of the ninth embodiment. In this modified embodiment, the capacitor 42 is replaced by Zener diodes 47a and 47b which are serial connected so as to have opposite polarities and interposed between the base and collector electrodes of bipolar transistor 46A. Zener diode 47a has an anode connected to the collector electrode of bipolar transistor 46A. Zener diode 47b has an anode connected to the base electrode of bipolar transistor 46A. The cathode of Zener diode 47a is directly connected to the cathode of Zener diode 47b.

According to this circuit arrangement, the next surge current flows through Zener diodes 47a and 47b. The Zener diode 47b causes breakdown in response to the next surge current. The next surge current charges the base-emitter junction capacitor of bipolar transistor 46A. In response to this charging operation, the bipolar transistor 46A turns on. Subsequently, the next surge current flows into the gate electrode of main FET 10 which is connected to the emitter electrode of bipolar transistor 46A. When the gate potential of main FET 10 exceeds a threshold value, the main FET 10 turns on. Thus, a sufficient amount of late surge current flows through the activated main FET 10.

Thus, the ninth embodiment provides another protecting apparatus for protecting a main transistor (10) formed on a semiconductor substrate from a rapid surge. A protecting transistor (46A) has an output terminal connected to a control terminal of the main transistor (10) and an input terminal connected to an input terminal of the main transistor (10). The protecting transistor (46A) comprises a built-in back-flow preventing Zener diode. A Zener diode circuit (47a, 47b) is connected between a control terminal of the protecting transistor (46A) and the input terminal of the main transistor (10) for allowing initial surge current, when caused based on a rapid surge, to flow into the control terminal of the protecting transistor (10). The protecting transistor (46A), when turning on in response to the initial surge current, allows next surge current succeeding the initial surge current to flow into the control terminal of the main transistor (10). And, the main transistor (10), when turning on in response to the next surge current, allows late surge current succeeding the next surge current to flow therethrough.

Tenth Embodiment

Figure 16A:
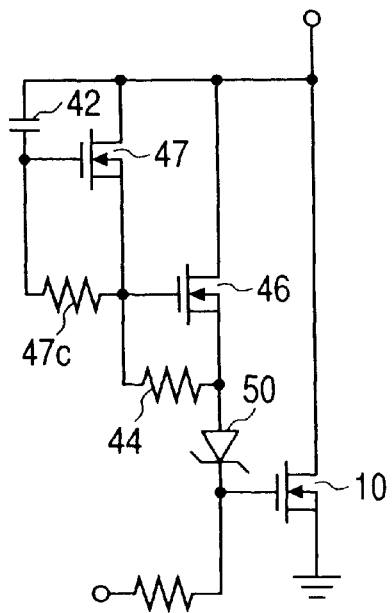
FIG. 16A is a circuit diagram showing an arrangement of a semiconductor device in accordance with a tenth embodiment of the present invention.

FIG. 16A shows a semiconductor device in accordance with a tenth embodiment of the present invention. The tenth embodiment differs from the seventh embodiment in that a MOSFET 47 and a resister 47c are additionally provided.

A drain electrode of FET 47 is connected to the drain electrode of FET 46. A source electrode of FET 47 is connected to the gate electrode of FET 46. A gate electrode of FET 47 is connected via the capacitor 42 to the drain electrode of FET 47, and is also connected via the resister 47c to the gate terminal of FET 46.

According to the circuit arrangement of the tenth embodiment, the gate electrode of FET 47 is charged by the capacitor 42. The gate electrode of FET 46 is charged by the activated FET 47. Thus, it becomes possible to increase the gate potential of FET 46 to a higher level.

Accordingly, a great amount of current flows through the main FET 10. As a result, it becomes possible to increase the bias voltage of the gate electrode of main FET 10 to a further higher level. This maximizes the drain saturation current responsive to turning-on operation of the main FET 10. Accordingly, the tenth embodiment improves the ESD durability. The ESD durability can be further improved by increasing the total number of FETs in the protecting circuit.

Thus, the tenth embodiment provides a protecting circuit including an auxiliary protecting transistor (47) connected between the protecting transistor (46) and the protecting capacitor (42) for amplifying the initial surge current and supplying the amplified initial surge current to the control terminal of the protecting transistor (46).

Figure 16B:
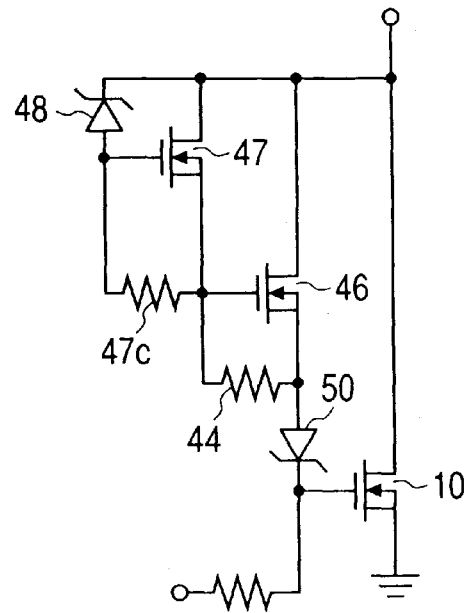
FIG. 16B is a circuit diagram showing an arrangement of a modified semiconductor device in accordance with the tenth embodiment of the present invention.

FIG. 16B shows a modification of the tenth embodiment. In this modified embodiment, the capacitor 42 is replaced by Zener diode 48 which is interposed between the gate and drain electrodes of FET 47.

According to this circuit arrangement, the gate electrode of FET 47 is charged by the Zener diode 48. The gate electrode of FET 46 is charged by the activated FET 47. Thus, it becomes possible to increase the gate potential of FET 46 to a higher level.

Thus, the tenth embodiment provides another protecting circuit including an auxiliary protecting transistor (47) connected between the protecting transistor (46) and the Zener diode circuit (48) for amplifying the initial surge current and supplying the amplified initial surge current to the control terminal of the protecting transistor (46).

Eleventh Embodiment

Figure 17A:
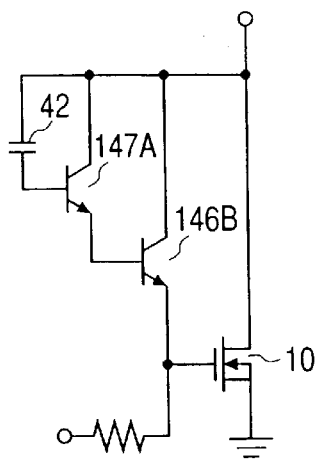
FIG. 17A is a circuit diagram showing an arrangement of a semiconductor device in accordance with an eleventh embodiment of the present invention.

FIG. 17A shows a semiconductor device in accordance with an eleventh embodiment of the present invention. The eleventh embodiment differs from the tenth embodiment (refer to FIG. 10A) in that the bipolar transistors 147A and 146B are provided instead of using the FETs 47 and 46.

A collector electrode of bipolar transistor 147A is connected to a collector electrode of bipolar transistor 146B. An emitter electrode of bipolar transistor 147A is connected to a base electrode of bipolar transistor 146B. A base electrode of bipolar transistor 147A is connected via the capacitor 42 to the collector electrode of bipolar transistor 147A. The bipolar transistor 146B has an emitter electrode connected to the gate electrode of FET 10. The eleventh embodiment does not include the Zener diode 50 and resisters 47c and 44 of the tenth embodiment.

According to the circuit arrangement of the eleventh embodiment, the bipolar transistors 147A and 146B are connected in a so-called Darlington connecting pattern. This sufficiently amplifies the initial surge current flowing through the capacitor 42. Accordingly, the gate potential of main FET 10 can be increased to a higher level. Thus, it becomes possible to increase the drain saturation current of the main FET 10. The eleventh embodiment improves the ESD durability. The ESD durability can be further improved by increasing the total number of bipolar transistors. Furthermore, the ESD durability can be further improved by adopting a combination of bipolar transistor(s) and LDMOS-FET(s).

The bipolar transistor inherently has a base-emitter diode. Thus, the Zener diode 50 can be removed.

Thus, the eleventh embodiment provides a protecting circuit including an auxiliary protecting transistor (147A) connected between the protecting transistor (146B) and the protecting capacitor (42) for amplifying the initial surge current and supplying the amplified initial surge current to the control terminal of the protecting transistor (146B).

Figure 17B:
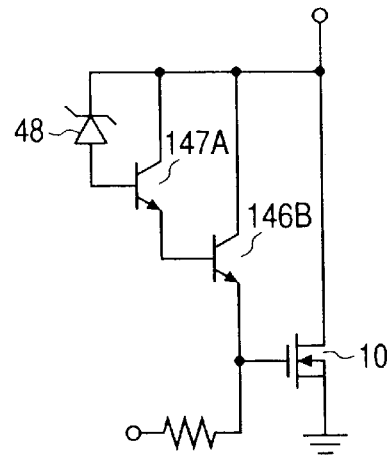
FIG. 17B is a circuit diagram showing an arrangement of a modified semiconductor device in accordance with the eleventh embodiment of the present invention.

FIG. 17B shows a modification of the eleventh embodiment. In this modified embodiment, the capacitor 42 is replaced by Zener diode 48 which is interposed between the base and collector electrodes of the bipolar transistor 147A.

According to this circuit arrangement, the base electrode of the bipolar transistor 147A is charged by the Zener diode 48. The base electrode of the bipolar transistor 146B is charged by the activated bipolar transistor 147A.

Thus, the eleventh embodiment provides another protecting circuit including an auxiliary protecting transistor (147A) connected between the protecting transistor (146B) and the Zener diode circuit (48) for amplifying the initial surge current and supplying the amplified initial surge current to the control terminal of the protecting transistor.

Twelfth Embodiment

Figure 18A:
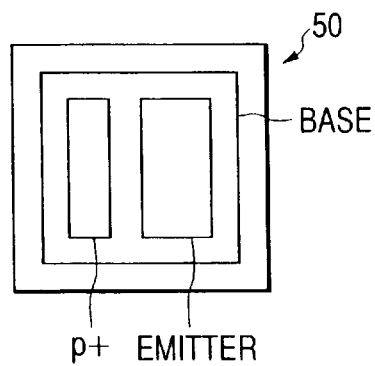
FIG. 18A is a plan view showing a Zener diode in accordance with a twelfth embodiment of the present invention.

FIG. 18A shows a twelfth embodiment which relates to an improvement of the structure of Zener diode 50.

Figure 18B:
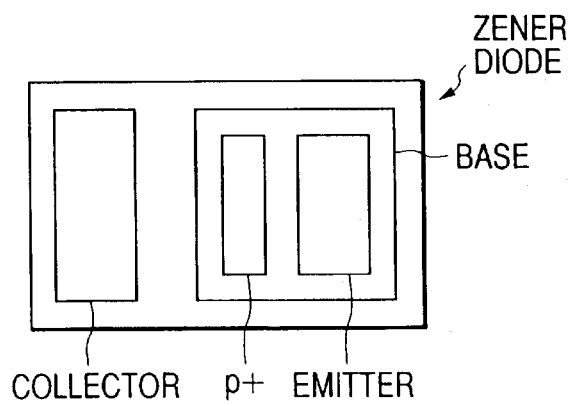
FIG. 18B is a plan view showing a conventional Zener diode.

A conventional Zener diode is formed by utilizing the withstand voltage (approximately 8V) between the emitter and base electrodes of a NPN transistor. Namely, the collector and base terminals of the bipolar transistor are short-circuited to use the base terminal as an anode and also use the emitter as a cathode. In this case, the n-type region and the p-type element isolation region of the collector are reverse biased (refer to FIG. 18B).

Accordingly, to realize the element isolation, the conventional Zener diode needs to have a collector region which is inherently unnecessary for the Zener diode. In other words, the conventional Zener diode requires a large space.

In view of the foregoing, the twelfth embodiment omits the collector region as shown in FIG. 18A because the potential of the n-type substrate can be used in a floating condition. Thus, the twelfth embodiment provides the Zener diode 50 having excellent space utility.

FIG. 19 shows a modification of the twelfth embodiment. To decrease the parasitic serial resistance of Zener diode 50, the modified embodiment employs a characteristic layout which extends the confronting length of the base and emitter electrodes. To reduce the resistance value, both of the cathode and anode electrodes are formed by first and second aluminum wiring layers, respectively.

Figure 20A:
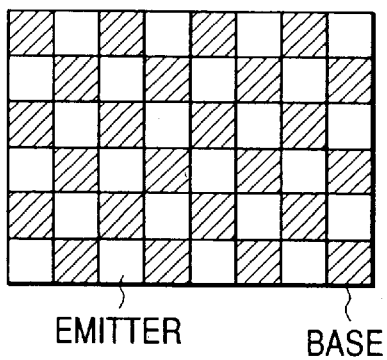
FIG. 20A is a plan view showing another modified Zener diode in accordance with the twelfth embodiment of the present invention.
Figure 20B:
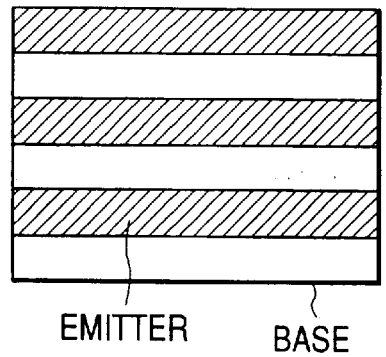
FIG. 20B is a plan view showing another modified Zener diode in accordance with the twelfth embodiment of the present invention.

According to this modified embodiment, the emitter and base contacts of the Zener diode 50 can be arranged in a diced pattern as shown in FIG. 20A or in a stripe pattern as shown in FIG. 20B.

Figure 21:
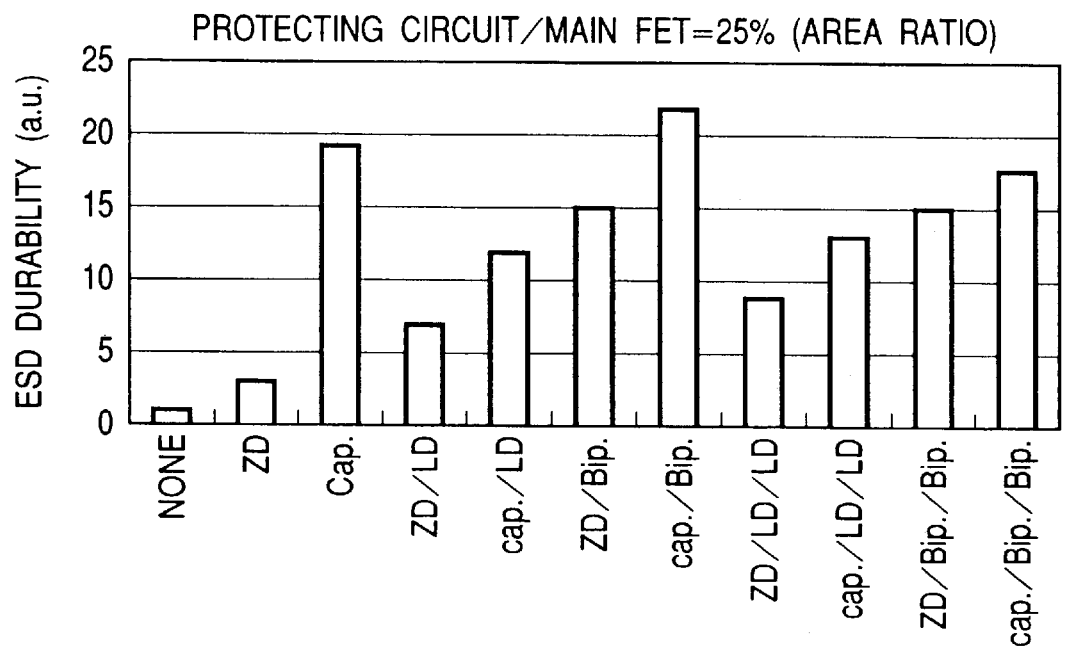
FIG. 21 is a graph showing evaluation result of ESD durability of the embodiments of the present invention.
Figure 22:
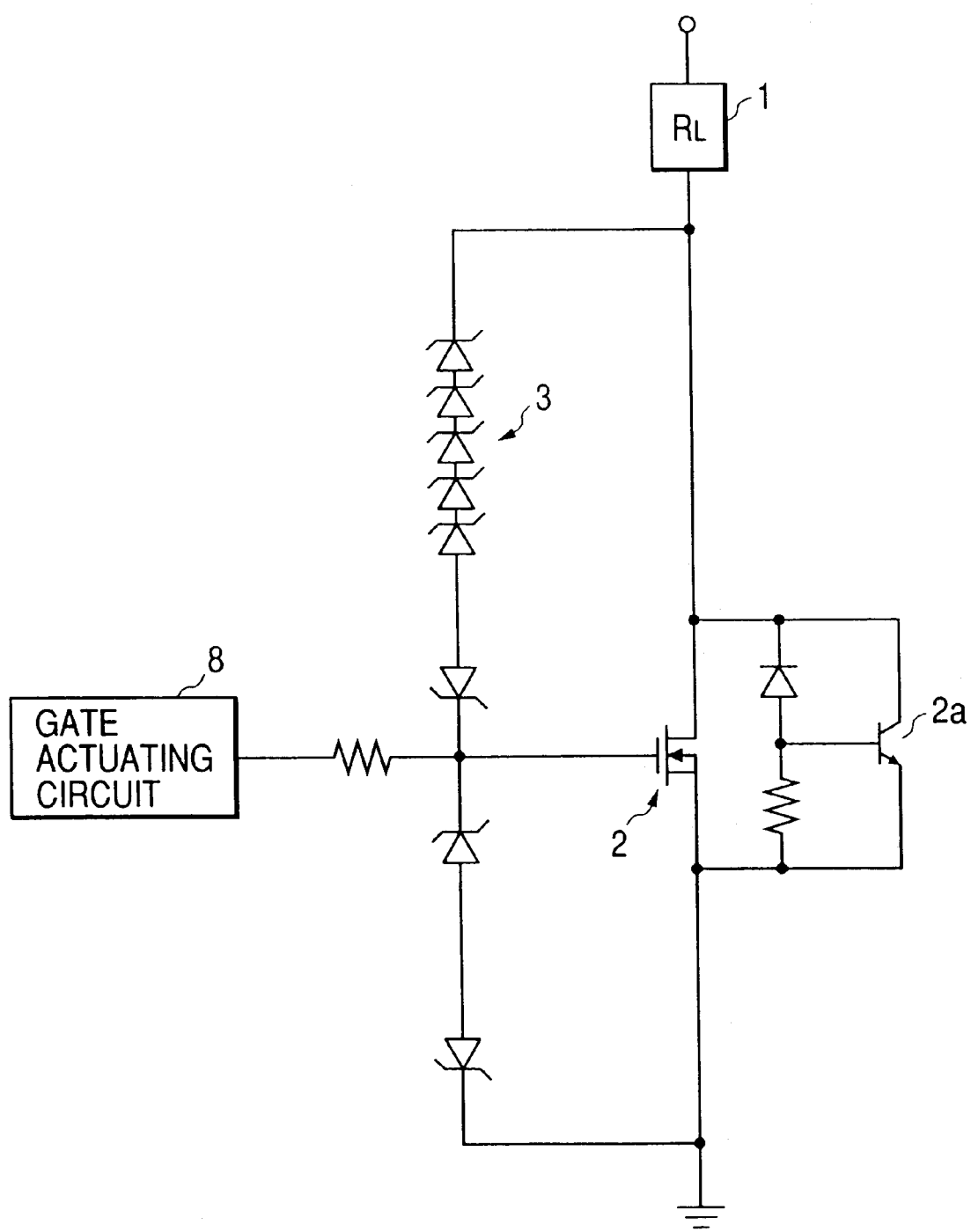
FIG. 22 is a circuit diagram showing an arrangement of a conventional semiconductor device.

FIG. 21 shows evaluation result of the ESD durability of each protecting circuit in the above-described embodiments.

In the graph of FIG. 21, "ZD" represents a case where the protecting circuit includes a Zener diode. "Cap." represents a case where the protecting circuit includes a capacitor. "ZD/LD" represents a case where the protecting circuit includes a Zener diode and an auxiliary MOSFET (FET 41).

"Cap./LD" represents a case where the protecting circuit includes a capacitor and an auxiliary MOSFET (FET 41). "ZD/Bip." represents a case where the protecting circuit includes a Zener diode and a bipolar transistor. "cap./Bip." represents a case where the protecting circuit includes a capacitor and a bipolar transistor. "ZD/LD/LD" represents a case where the protecting circuit includes a Zener diode and two auxiliary MOSFETs (FETs 46 and 47).

Furthermore, "cap./LD/LD" represents a case where the protecting circuit includes a capacitor and two auxiliary MOSFETs (FETs 46 and 47). "ZD/Bip./Bip." represents a case where the protecting circuit includes a Zener diode and two bipolar transistors (146B and 147A). "cap./Bip./Bip." represents a case where the protecting circuit includes a capacitor and two bipolar transistors (146B and 147A). Moreover, "None" represents a case where protecting circuit includes none of the Zener diode, the capacitor, the auxiliary MOSFET, and the bipolar transistor.

The MOSFET described in the above-described embodiments is not limited to a laterally double diffused MOS (i.e., LDMOS) and therefore can be replaced by a vertically double diffused MOS (i.e., VDMOS). Furthermore, the MOSFET may be an insulating isolation type (SOI/trench isolation type) or a junction isolation type.

Furthermore, the MOSFET may be a so-called IGBT (Insulated Gate Bipolar Transistor).

Although the electric load is connected between the power supply line and the drain electrode of the main FET in the above-described embodiment, it is of course possible to dispose the electric load between the source electrode of the main FET and the ground terminal.

Thirteenth Embodiment

A thirteenth embodiment of the present invention is applied to an electric load actuating intelligent power IC (integrated circuit) installable in an automotive vehicle. The automotive vehicle has a controller incorporating a load actuating circuit. A battery (18V) of the automotive vehicle supplies electric power to this electric load actuating intelligent power IC.

Figure 24:
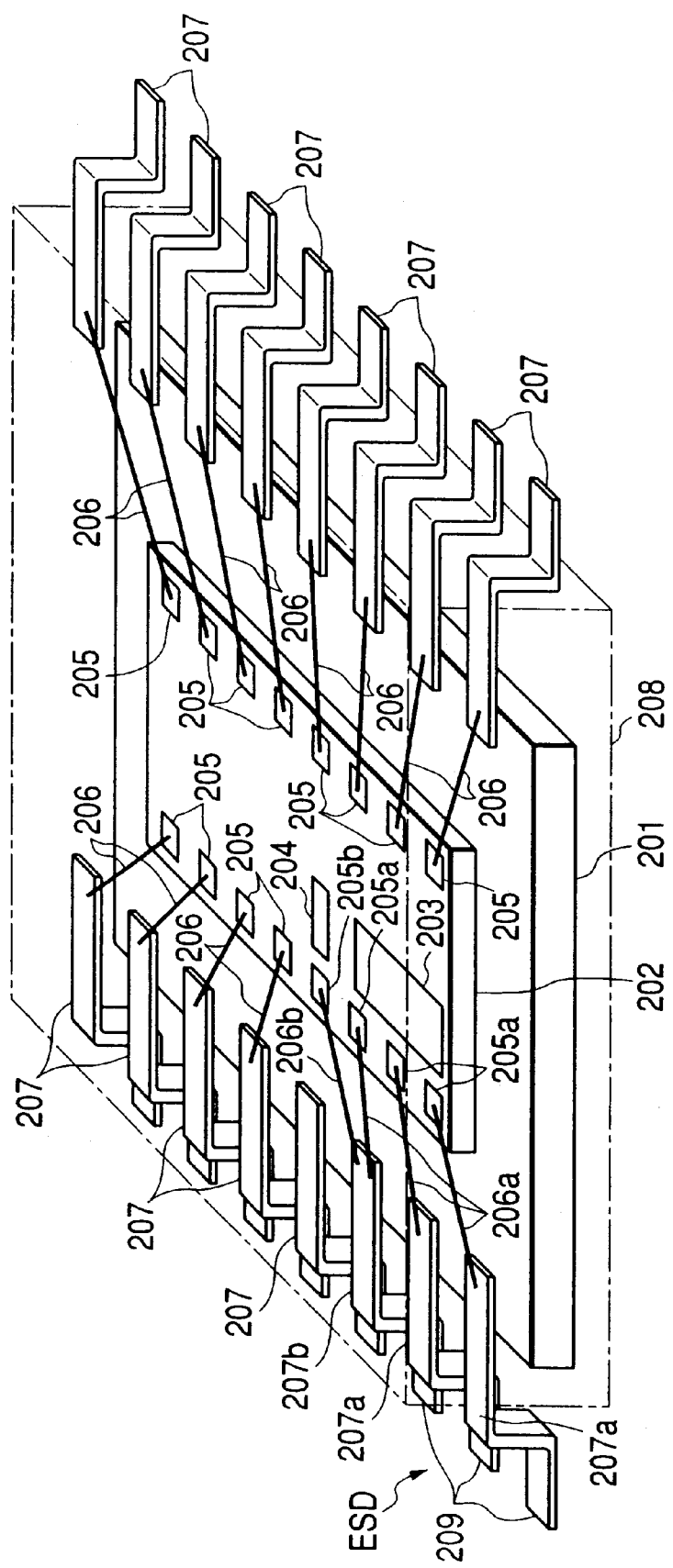
FIG. 24 is a perspective view showing a semiconductor device in accordance with a thirteenth embodiment of the present invention.
Figure 25:
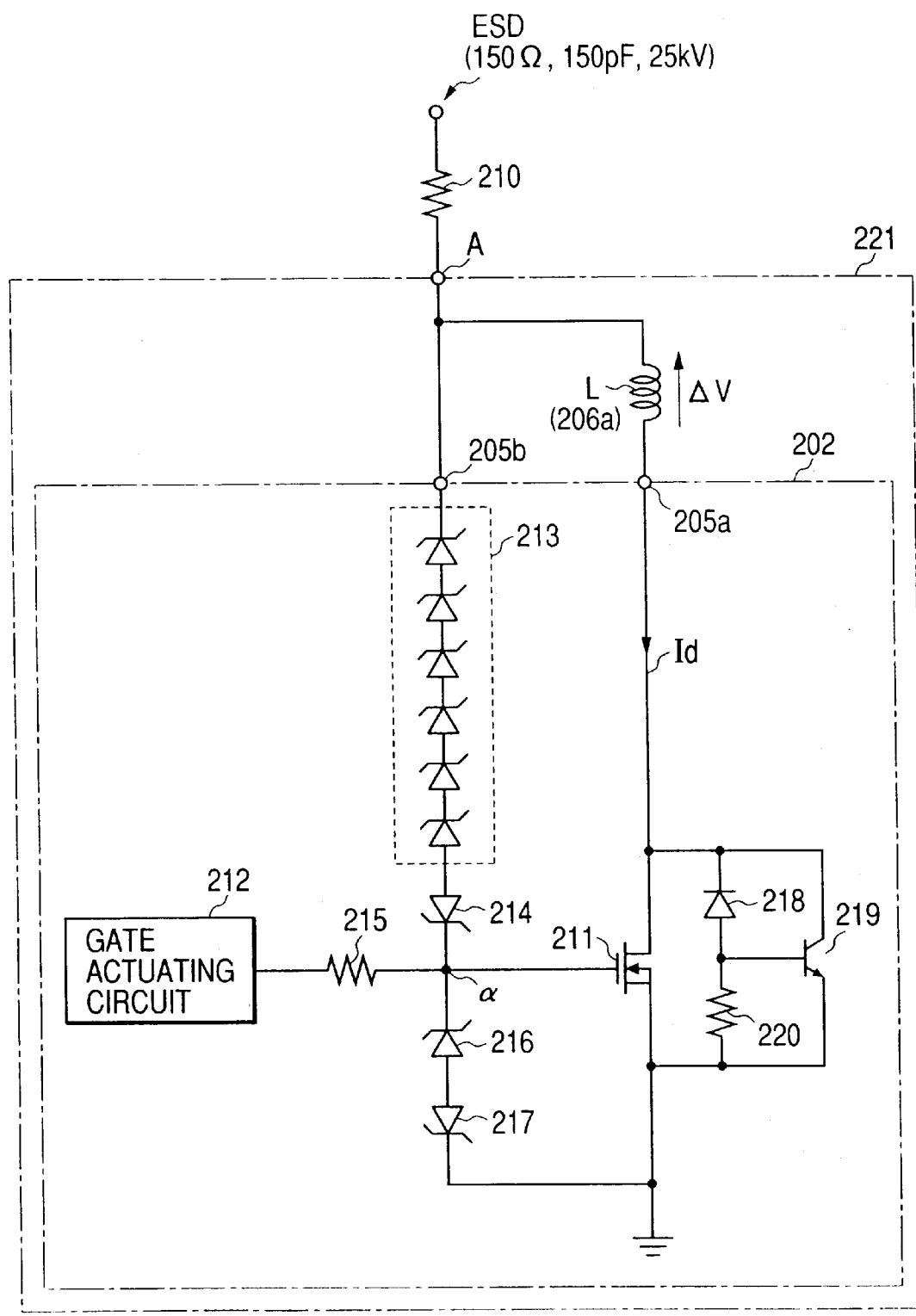
FIG. 25 is a circuit diagram showing an arrangement of a semiconductor device in accordance with the thirteenth embodiment of the present invention.

FIG. 24 shows a semiconductor device in accordance with the thirteenth embodiment of the present invention. FIG. 25 shows a load actuating circuit in accordance with the thirteenth embodiment of the present invention.

A main FET 211, which is a LDMOSFET serving as a power transistor, is disposed in a current path of an electric load 210. Zener diode group (i.e., a serial circuit of Zener diodes) 213 is employed as a gate voltage boosting element for activating the main FET 211 in response to an applied surge.

More specifically, in FIG. 24, an IC chip 202 is mounted on a stem 201. IC chip 202 includes a region 203 in which the main FET 211 is formed and a region 204 in which Zener diode group 213 is formed. Numerous aluminum pads 205 are formed along peripheral sides of a rectangular surface of IC chip 202. A bonding pad 205a is a high-voltage terminal pad connected to a drain electrode of main FET 211. A bonding pad 205b is connected via an aluminum pattern wiring to one end (i.e., high-voltage terminal) of Zener diode group 213 (refer to FIG. 25).

Each bonding pad 205 is connected to a lead frame (e.g., lead pin) 207 via a bonding wire 206. The pad 205a is connected to the lead frame 207a via a bonding wire 206a. The pad 205b, i.e., the boosting element terminal pad, is connected to the lead frame 207b via a bonding wire 206b. In this manner, the bonding wire 206b extends externally from the pad 205b of IC chip 202 to the high-voltage power line (i.e., lead frame 207b) of main FET 211.

The stem 201, IC chip 202, bonding wire 206, and lead frame 207 are integrally molded as a package by a molding resin 208. Electric load 210, such as a fuel injection valve and an air bag ignitor, is connected to an output terminal (i.e., output pin) 209 of main FET.

The molded IC (i.e., IC chip 202) is accommodated in a control box (i.e., Electronic Control Unit) 221 which is disposed in an engine room of an automotive vehicle. ECU 221 is thus subjected to surges caused in the engine room, for example due to ignition pulses.

As shown in FIG. 25, IC chip 202 comprises main FET 211, gate actuating circuit 212, gate voltage boosting Zener diode group 213, Zener diode 214, resister 215, and Zener diodes 216 and 217. The main FET 211 is an insulated gate transistor serving as a load actuating power element. The main FET 211 has a source electrode grounded and a drain electrode connected to the electric load 210. The battery voltage is applied to the electric load 210 which is substantially a resister or an inductance.

A gate electrode of main FET 211 is connected via a resister 215 to the gate actuating circuit 212. The resistance value of resister 215 is approximately 10 kΩ. The gate actuating circuit 212 produces an output signal to control the gate potential of the main FET 211. When the gate potential exceeds a threshold voltage level of the main FET 211, the main FET 211 turns on so as to activate the electric load 210. The main FET 211 formed in the IC chip 202 has a high-voltage terminal connected to the electric load 210.

The Zener diode group 213 is interposed between the gate electrode (i.e., point α) of main FET 211 and the pad 205b. Each Zener diode of Zener diode group 213 has a cathode directed to the pad 205b. The Zener diode group 213, serving as the gate voltage boosting element, has the other end (i.e., low-voltage terminal) connected to the gate electrode of main FET 211. When a surge voltage is applied to the high-voltage terminal of main FET 211, the Zener diode group 213 causes breakdown and charges the gate electrode of main FET 211. The Zener diode group 213 includes a total of six Zener diodes serially connected. Each Zener diode of the six-stage Zener diode group 213 has a withstand voltage of approximately 8V.

Zener diode 214, interposed between the Zener diode group 213 and the gate electrode (i.e., point α) of main FET 211, has a cathode directed to the point α. Zener diode 214 is a back-flow preventing Zener diode having a withstand voltage larger than the gate actuating voltage.

Zener diode 216 is disposed between the gate electrode (i.e., point α) of main FET 211 and the source electrode of main FET 211. Zener diode 216, having a cathode directed to the point α, clamps the output voltage of the gate actuating circuit 212 to an operation voltage. The withstand voltage of Zener diode 216 is approximately 8V.

Zener diode 217 is interposed between the anode of Zener diode 216 and the source electrode (=ground terminal) of main FET 211. Zener diode 217, having a cathode directed to the ground terminal, prevents the surge entering from the ground line. The withstand voltage of Zener diode 217 is approximately 100V.

The main FET 211 includes a built-in body diode 218 and a parasitic bipolar transistor 219. A base resister 220 is connected between the base electrode of bipolar transistor 219 and the ground terminal.

As shown in FIG. 24, a total of three bonding wires 206a straddle the IC chip 202 and three lead frames 207a and 207b. Each bonding wire 206a serves as parasitic inductance against an applied surge. This parasitic inductance (206a) is denoted by "L" in FIG. 25. The parasitic inductance "L" is located out of the IC chip 202 and connected in parallel with the Zener diode group 213 with respect to the drain electrode of main FET 211.

The above-described semiconductor device functions in the following manner.

When ECU 221 receives the ESD surge applied from the electric load 210, the surge current flows into the gate electrode of main FET 211 via the Zener diode group 213 as well as into the drain electrode of main FET 211. In this case, the parasitic inductance "L" causes a voltage drop ΔV which substantially raises the potential level of the high-voltage terminal (i.e., point A) of Zener diode group 213. Thus, the gate charge voltage increases. The operation current of main FET 211 increases. As a result, the ESD surge durability is improved.

Although the gate voltage boosting element of FIG. 25 is constituted by the Zener diode group 213. It is possible to use a single Zener diode as the gate voltage boosting element. Furthermore, the circuit arrangement of FIG. 25 is replaceable by any one of circuit arrangements shown in FIGS. 26 to 30.

Figure 26:
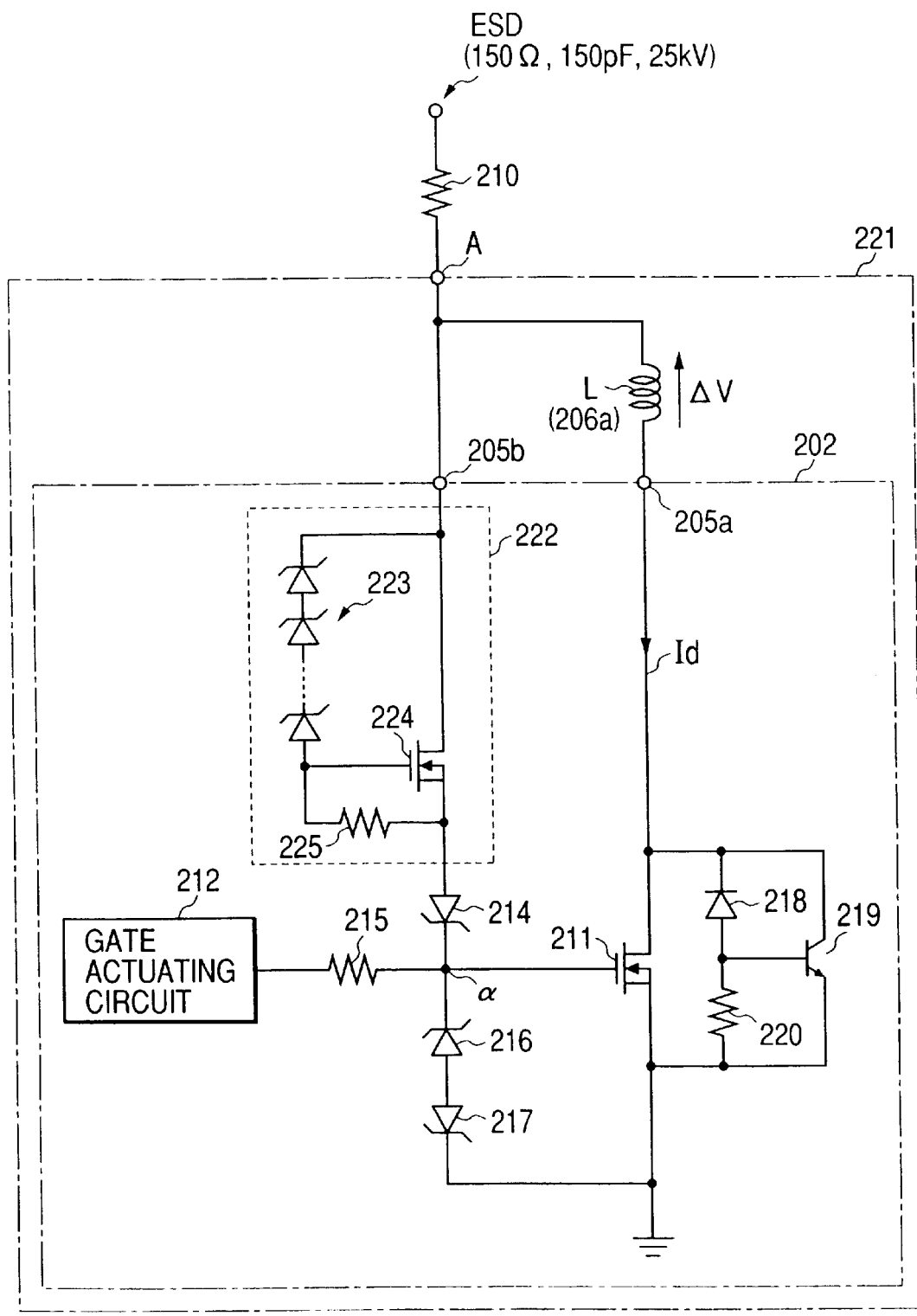
FIG. 26 is a circuit diagram showing an arrangement of another semiconductor device in accordance with the thirteenth embodiment of the present invention.

The circuit arrangement of FIG. 26 differs from the circuit arrangement of FIG. 25 in that Zener diode group 213 is replaced by a gate voltage boosting element 222. The gate voltage boosting element 222 includes a Zener diode group (i.e., a serial circuit of Zener diodes) 223, an auxiliary FET (e.g., LDMOSFET) 224 and a resister 225.

The auxiliary FET 224 has a drain electrode connected to the pad 205b and a source electrode connected to the anode of the back-flow preventing Zener diode 214. The Zener diode group 223 is interposed between the drain and gate electrodes of auxiliary FET 224. The resister 225 is interposed between the source and gate electrodes of auxiliary FET 224.

Figure 27:
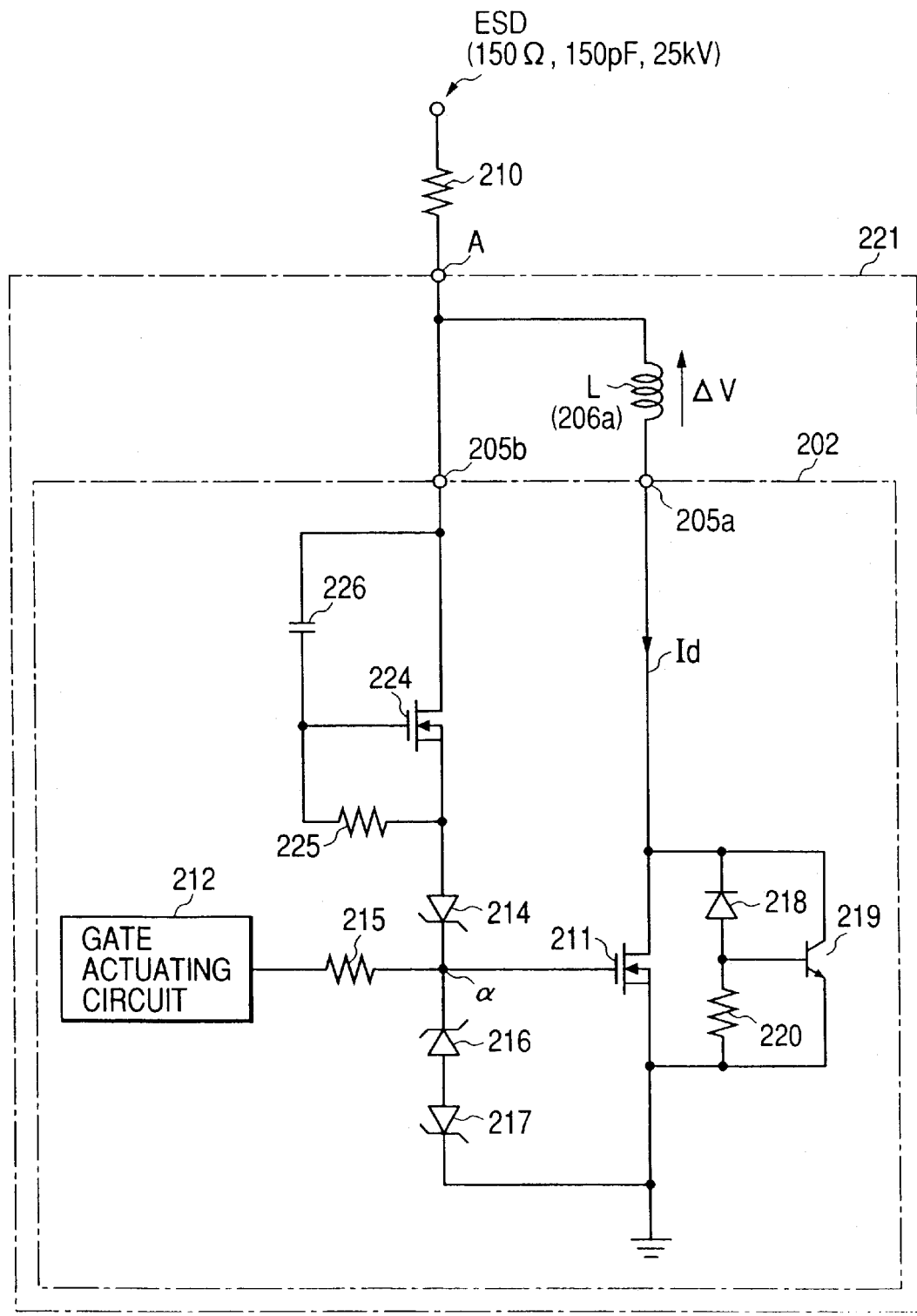
FIG. 27 is a circuit diagram showing an arrangement of another semiconductor device in accordance with the thirteenth embodiment of the present invention.

The circuit arrangement of FIG. 27 differs from the circuit arrangement of FIG. 26 in that Zener diode group 223 is replaced by a capacitor 226.

Figure 28:
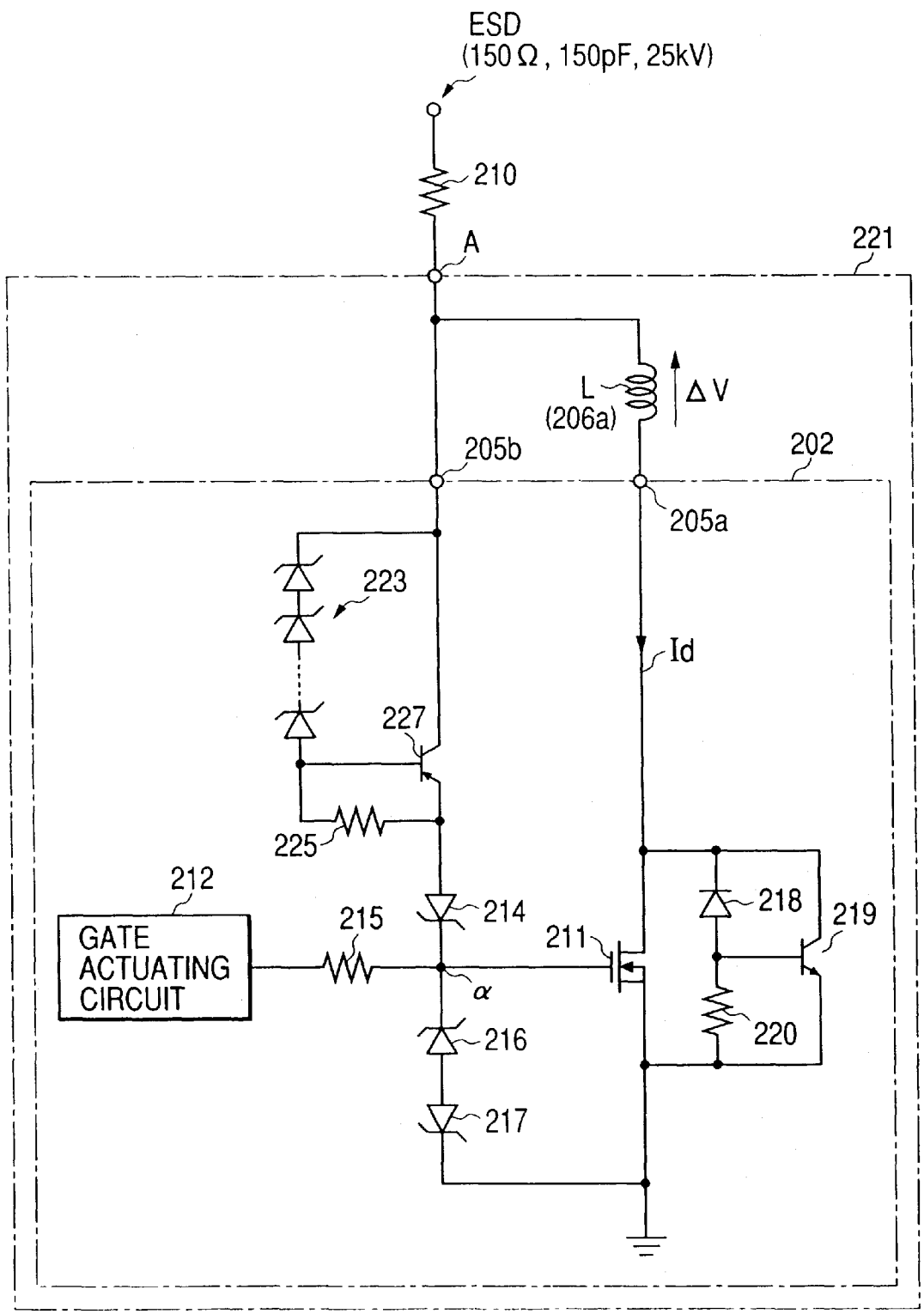
FIG. 28 is a circuit diagram showing an arrangement of another semiconductor device in accordance with the thirteenth embodiment of the present invention.

The circuit arrangement of FIG. 28 differs from the circuit arrangement of FIG. 26 in that auxiliary FET 224 is is replaced by a bipolar transistor 227.

Figure 29:
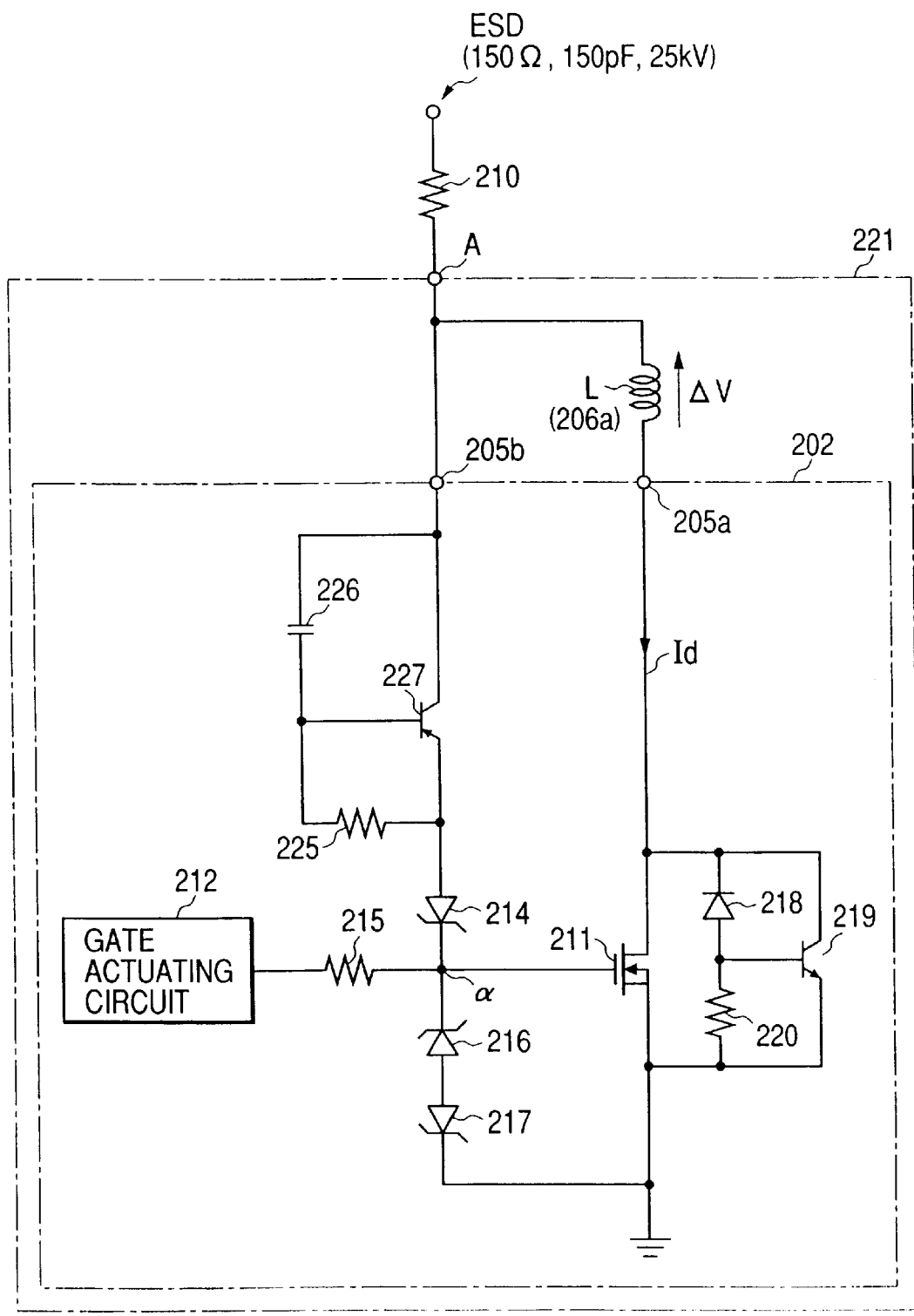
FIG. 29 is a circuit diagram showing an arrangement of another semiconductor device in accordance with the thirteenth embodiment of the present invention.

The circuit arrangement of FIG. 29 differs from the circuit arrangement of FIG. 27 in that Zener diode group 223 is replaced by the capacitor 226.

Figure 30:
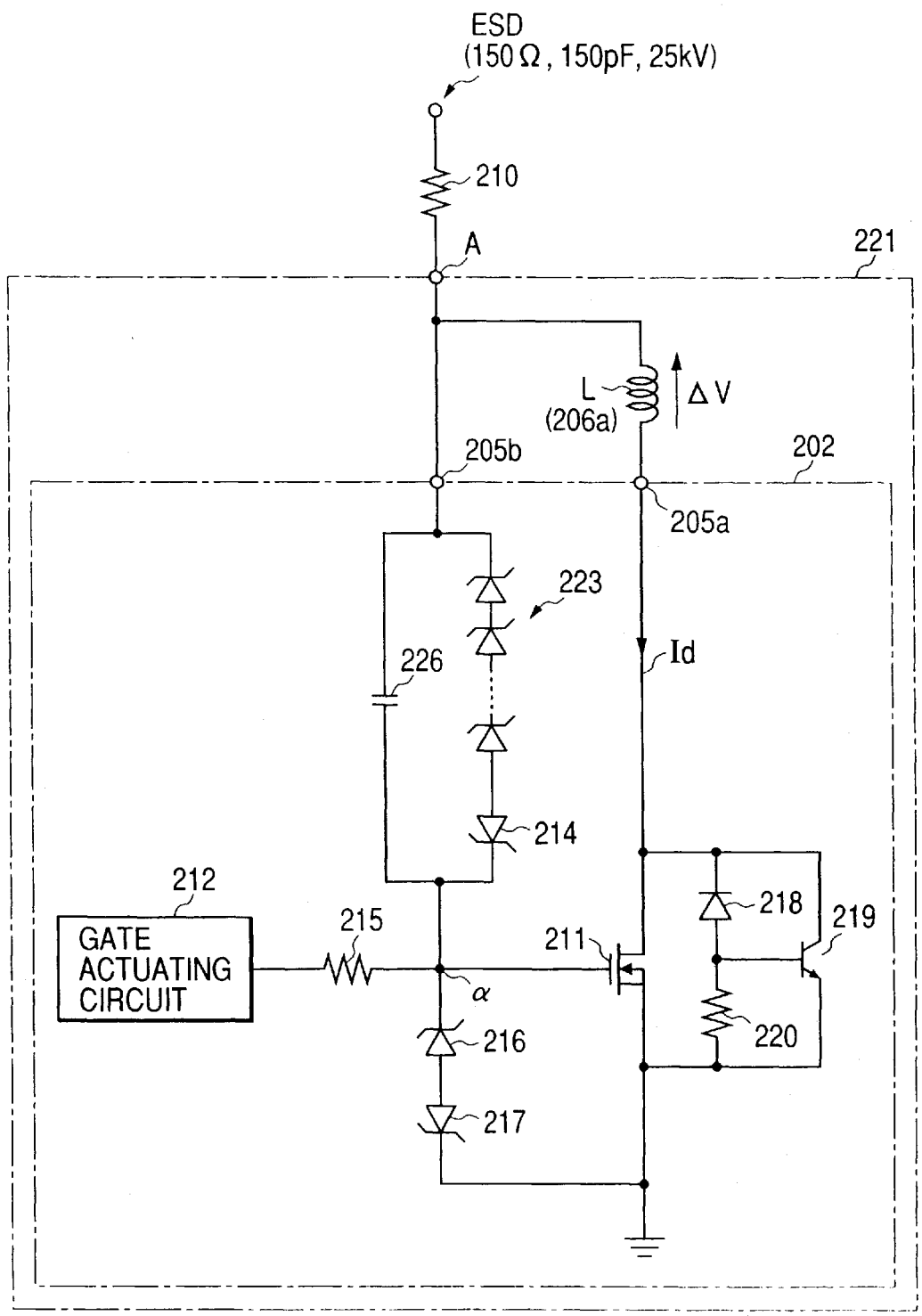
FIG. 30 is a circuit diagram showing an arrangement of another semiconductor device in accordance with the thirteenth embodiment of the present invention.

The circuit arrangement of FIG. 30 differs from the circuit arrangement of FIG. 25 in that the capacitor 226 is connected between the pad 205b and the point α in parallel with the serial circuit of Zener diode group 223 and the back-flow preventing Zener diode 214.

FIG. 31 shows the IC chip 202 molded by the molding resin 208 and mounted on a printed circuit board 230. More specifically, a source-ground wiring lead 231 and a drain output wiring lead 232 are formed on the surface of the printed circuit board 230. The lead frames 207 are connected to the lead patterns 231, 232 and 233. A socket 234 is provided at an edge of the printed circuit board 230. The electric load 210 is detachably connected with IC chip 202 via the socket 234.

More specifically, three bonding wires 206a, three lead frames 207a, and the wiring lead 232 cooperatively form a high-voltage power supply line of the main FET 211. At the same time, these bonding wires 206a, lead frames 207a, and the wiring lead 232 are wiring members cooperatively constituting the parasitic inductance provided out of the IC chip 202.

Figures 32A, 32B:
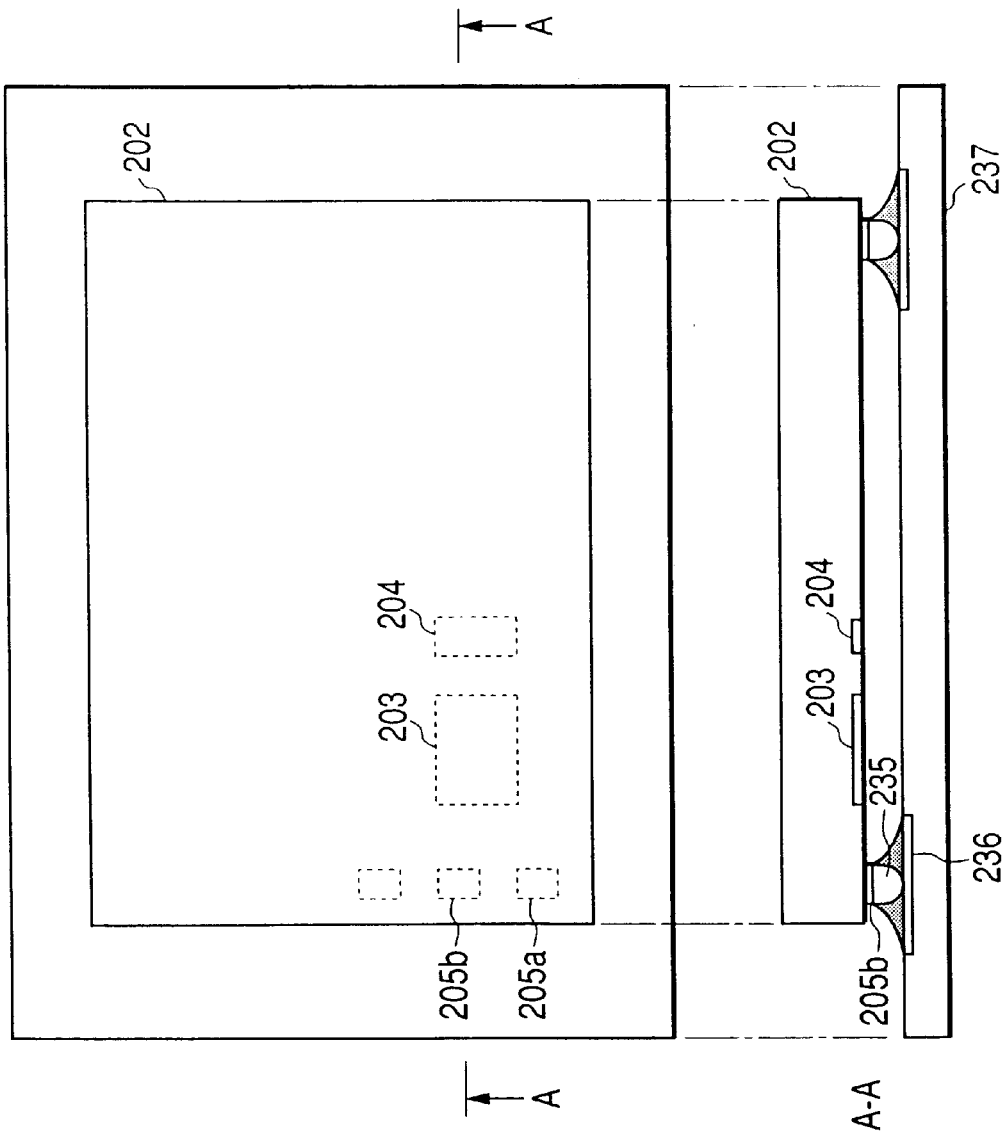
FIG. 32A is a plan view and FIG. 32B is a side view which cooperatively show another practical arrangement of the semiconductor device in accordance with the thirteenth embodiment of the present invention.

FIGS. 32A and 32B cooperatively show the IC chip 202 mounted on an insulating substrate 237 by using the flip chip bonding method. More specifically, a conductive pattern 236 is formed on the insulating substrate 237. The IC chip 202, held in an upside down condition, is disposed on the insulating substrate 237. Each bump 235 formed on the pad 205b is soldered to the conductive pattern 236. A conductive pattern, corresponding to the wiring lead 232 extending from the MOS drain pad 205a (refer to FIG. 31), is formed on the insulating substrate 237. This conductive pattern is connected to the conductive pattern 236 extending from the pad 205b.

Thus, the conductive pattern, corresponding to the wiring lead 232, extending from the pad 205a serves as the high-voltage power supply line of the main FET 211. Namely, the conductive pattern formed on the insulating substrate 237, which corresponds to the wiring lead 232 shown in FIG. 31, is a wiring member constituting the parasitic inductance provided out of the IC chip 202.

Figure 33:
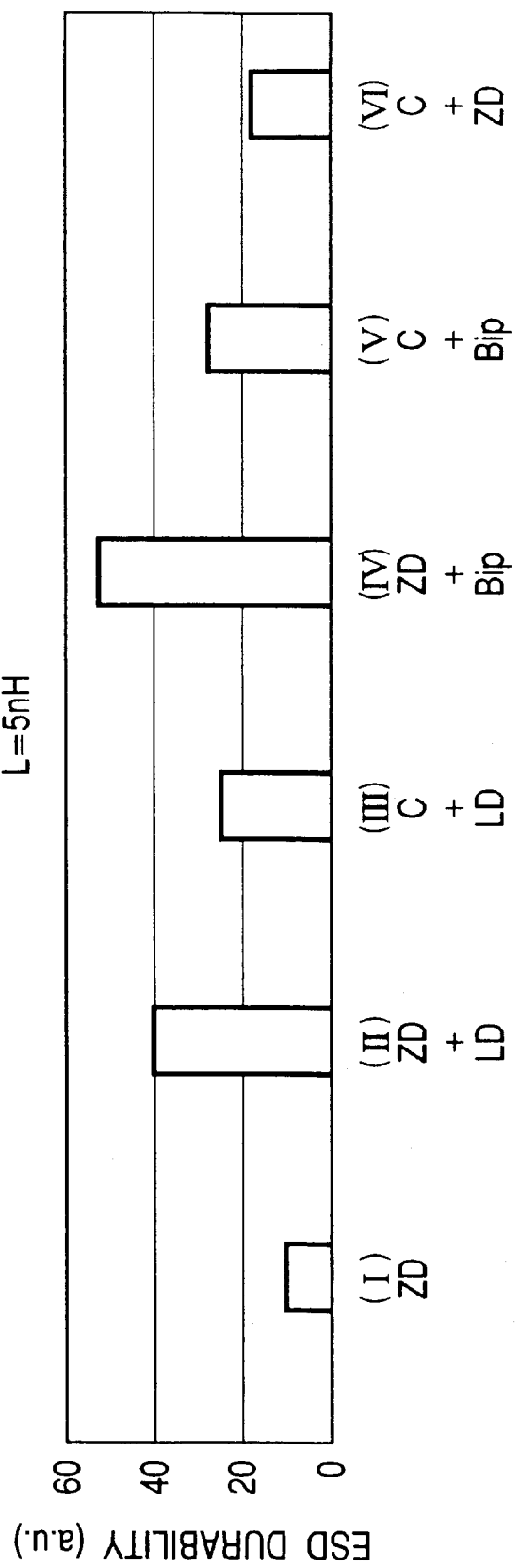
FIG. 33 is a graph showing evaluation result of ESD durability of the thirteenth embodiment of the present invention.

FIG. 33 shows evaluation result of the ESD durability of the above-described thirteenth embodiment.

In the graph of FIG. 33, "ZD" represents a case where the gate voltage boosting element includes the Zener diode group. "ZD+LD" represents a case where the gate voltage boosting element includes the Zener diode group and the auxiliary FET. "C+LD" represents a case where the gate voltage boosting element includes the capacitor and the auxiliary FET. "ZD+Bip" represents a case where the gate voltage boosting element includes the Zener diode group and the bipolar transistor. "C+Bip" represents a case where the gate voltage boosting element includes the capacitor and the bipolar transistor. "C+ZD" represents a case where the gate voltage boosting element includes the capacitor and the Zener diode group.

The evaluation of FIG. 33 is simulation result obtained under a condition that the parasitic inductance "L" is 5 nH (i.e., L=5 nH).

To maximize the ESD durability, the parasitic inductance "L" of the bonding wire and/or the printed pattern can be optimized based on a circuit simulator in the following manner.

Figure 34:
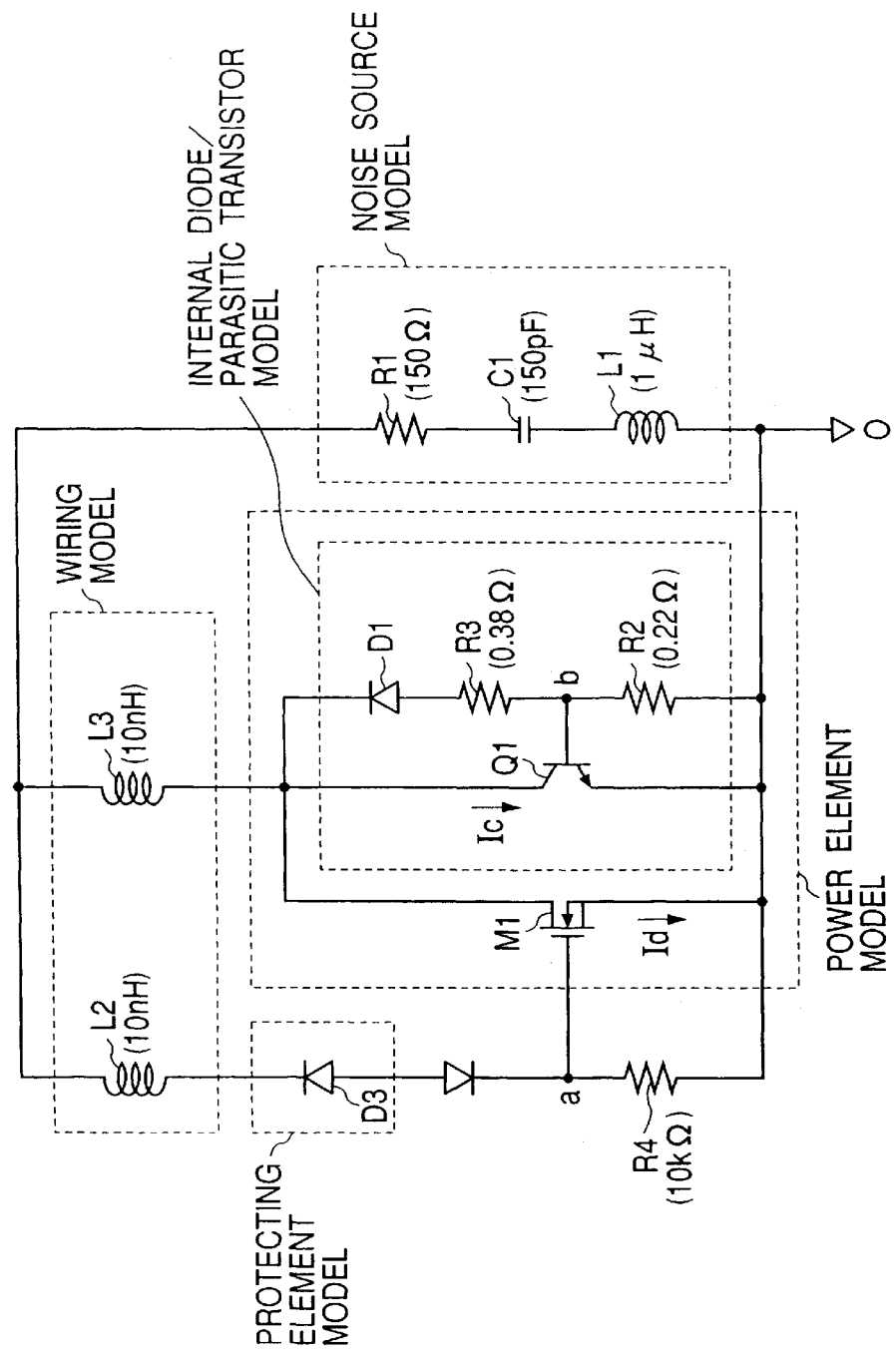
FIG. 34 is a circuit diagram showing a simulation model for obtaining an optimized parasitic inductance in accordance with the thirteenth embodiment of the present invention.

FIG. 34 shows an example of the simulation model. In FIG. 34, a Zener diode D3 is a protecting element model for protecting a LDMOS M1 (serving as a power element model). A circuit, consisting of a bipolar transistor Q1, a diode D1 and two resisters R2 and R3, is an internal diode/parasitic transistor model. Inductances L2 and L3 constitute a wiring model. A serial circuit, consisting of a resister R1, a capacitor C1 and an inductance L1, is a noise source model.

The ESD simulation is performed through the transient calculation of discharging of a predetermined capacitor (C=150 pF and R=150Ω). The discharge voltage is successively increased to detect the ESD durability. The ESD durability is a voltage at which the parasitic bipolar transistor Q1 turns on. Generally, the bipolar transistor Q1 causes positive feedback in which the operation current increases in response to the temperature increase. Thus, once the bipolar transistor Q1 turns on, the current flows therethrough in a concentrated manner, causing thermal excursion.

The maximum of the ESD durability is calculated by changing the inductance values of L2 and L3.

In the model of FIG. 34, R1=150Ω, C1=150 pF, L1=1 μH, L2=L3=10 nH, R2=0.22Ω, R3=0.38Ω, and R4=10 kΩ.

Figure 35:
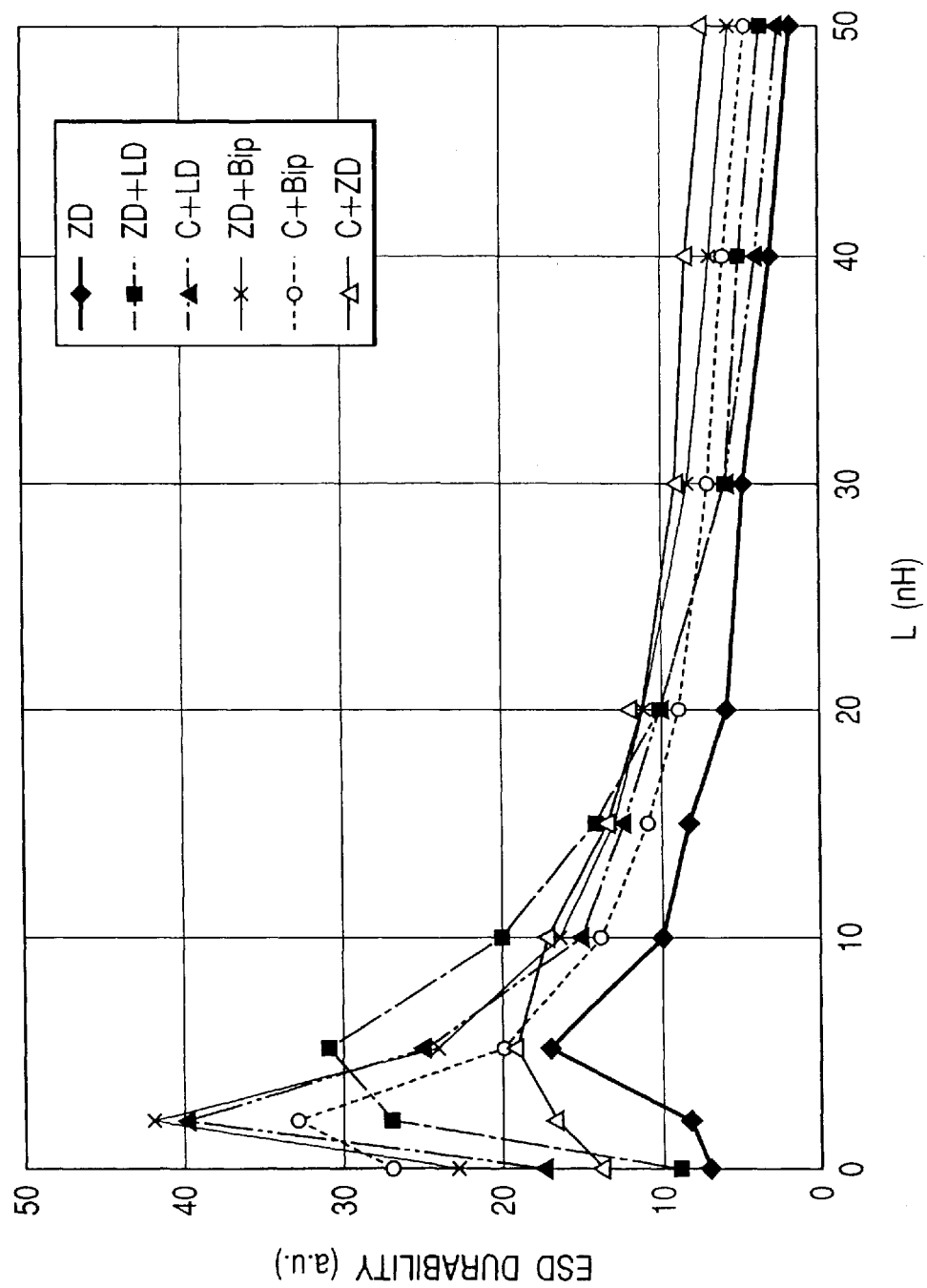
FIG. 35 is a graph showing simulation result of the simulation model shown in FIG. 34.
Figure 36A:
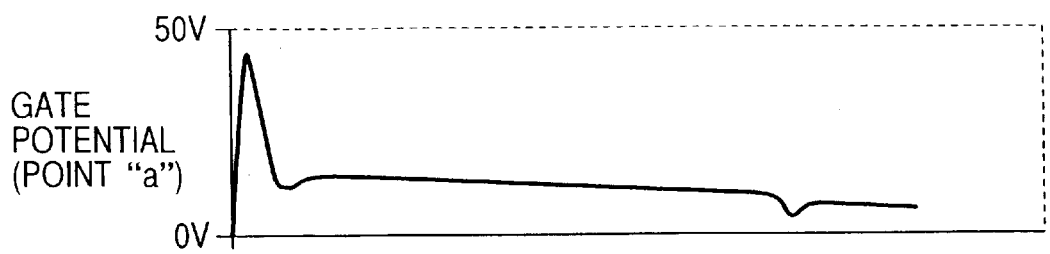
FIGS. 36A to 36D are time charts showing simulation result of the simulation model shown in FIG. 34.
Figure 36B:
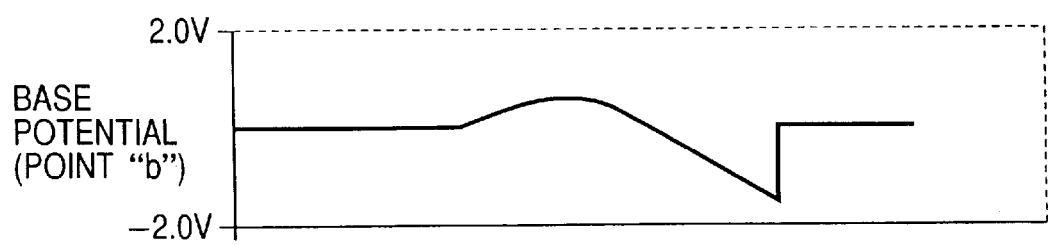
Figure 36C:
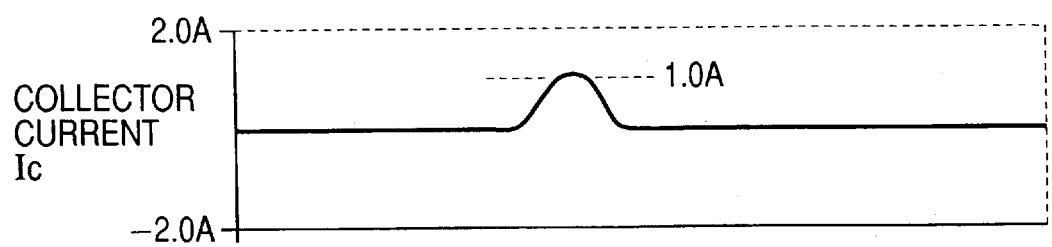
Figure 36D:
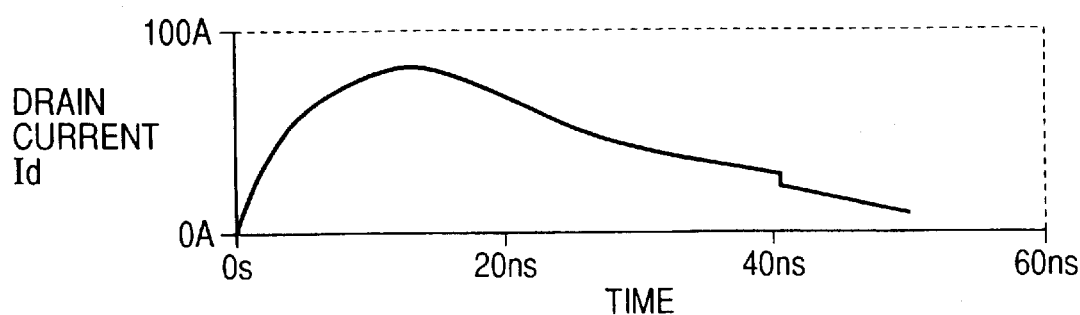

FIG. 35 shows the obtained calculation result, according to which an optimum range of the parasitic inductance "L" is 1 to 20 nH (i.e., L=1 to 20 nH). The parasitic inductance "L" of 1 to 20 nH corresponds to the wiring length of 1 to 15 mm for a bonding wire having a size φ=30 μm.

FIGS. 36A to 36D show simulation result (waveforms) of an ESD surge: i.e., gate potential at point "a" of FIG. 34; base potential at point "b" of FIG. 34; collector current Ic of FIG. 34; and drain current Id of FIG. 34, respectively. This simulation is performed under the condition that the used protecting element is a Zener diode, the parasitic inductance "L" is 5 nH (L=5 nH), and the applied ESD surge is 17 kV.

As understood from FIGS. 36A to 36D, the surge current cannot be sufficiently absorbed by the MOS current Id. Thus, it is believe from the fact that the collector current Ic reaches approximately 1.0 A that the base potential (point "b") of the parasitic transistor increases so large as to induce the transistor turn-on operation (forward voltage Vf>0.5V).

OTHER EMBODIMENT

Although not shown in the drawings, it is easy to incorporate the parasitic inductance "L" disclosed in the thirteenth embodiment into each of the circuit arrangements disclosed in the first to twelfth embodiments. Hence, the present invention is applied to such possible circuit arrangements combinable based on the disclosure of the preferred embodiments.

This invention may be embodied in several forms without departing from the spirit of essential characteristics thereof. The present embodiment as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A protecting apparatus for protecting a main transistor formed on a semiconductor substrate from a rapid surge, comprising:

a protecting transistor having an output terminal connected to a control terminal of said main transistor and an input terminal connected to an input terminal of said main transistor, said protecting transistor being composed of a bipolar transistor, and said protecting transistor comprising a built-in back-flow preventing Zener diode formed by an emitter and a base thereof; and a protecting capacitor connected between a control terminal of said protecting transistor and the input terminal of said main transistor for allowing initial surge current, when caused based on a rapid surge, to flow into the control terminal of said protecting transistor;

wherein a resistor element connected to said control terminal of said main transistor, but no resistor element being interposed between said control terminal of said protecting transistor and said output terminal of said protecting transistor;

said protecting transistor, when turning on in response to said initial surge current, allows next surge current succeeding said initial surge current to flow into the control terminal of said main transistor, and said main transistor, when turning on in response to said next surge current, allows late surge current succeeding said next surge current to flow therethrough.

2. The protecting apparatus for a semiconductor device in accordance with claim 1, wherein said main transistor is a metal oxide semiconductor field-effect transistor.

3. The protecting apparatus for a semiconductor device in accordance with claim 1, wherein said output terminal of said protecting transistor is connected directly to the control terminal of said main transistor without a diode.

4. The protecting apparatus for a semiconductor device in accordance with claim 1, wherein no resistor element is connected between the control terminal of the protecting transistor and ground.

5. A protecting apparatus for protecting a main transistor formed on a semiconductor substrate from a rapid surge, comprising:

a protecting transistor having an output terminal connected to a control terminal of said main transistor and an input terminal connected to an input terminal of said main transistor, said protecting transistor being composed of a bipolar transistor, and said protecting transistor comprising a built-in back-flow preventing Zener diode formed by an emitter and a base thereof; and a Zener diode circuit connected between a control terminal of said protecting transistor and the input terminal of said main transistor for allowing initial surge current, when caused based on a rapid surge, to flow into the control terminal of said protecting transistor, wherein a resistor element connected to said control terminal of said main transistor, but no resistor element being interposed between said control terminal of said protecting transistor and said output terminal of said protecting transistor;

said protecting transistor, when turning on in response to said initial surge current, allows next surge current succeeding said initial surge current to flow into the control terminal of said main transistor, and said main transistor, when turning on in response to said next surge current, allows late surge current succeeding said next surge current to flow therethrough.

6. The protecting apparatus for a semiconductor device in accordance with claim 5, wherein said main transistor is a metal oxide semiconductor field-effect transistor.

7. The protecting apparatus for a semiconductor device in accordance with claim 5, wherein said output terminal of said protecting transistor is connected directly to the control terminal of said main transistor without a diode.

* * * * *